United States Patent
Yano et al.

(10) Patent No.: US 7,166,884 B2
(45) Date of Patent: Jan. 23, 2007

(54) METHOD FOR FABRICATING SEMICONDUCTOR DEVICE AND SEMICONDUCTOR DEVICE

(75) Inventors: Hisashi Yano, Kyoto (JP); Shinichiro Hayashi, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/022,973

(22) Filed: Dec. 28, 2004

(65) Prior Publication Data
US 2005/0153462 A1     Jul. 14, 2005

(30) Foreign Application Priority Data
Jan. 8, 2004  (JP) .............................. 2004-003071

(51) Int. Cl.
*H01L 27/108*  (2006.01)
*H01L 21/00*  (2006.01)
*H01L 21/8242*  (2006.01)

(52) U.S. Cl. ................... 257/310; 257/306; 438/3; 438/243; 438/240; 438/386

(58) Field of Classification Search ............... 438/3, 438/243, 240, 386; 257/301, 310, 306
See application file for complete search history.

(56) References Cited

U.S. PATENT DOCUMENTS

| 5,525,434 A |   | 6/1996 | Nashimoto |
|---|---|---|---|
| 6,100,200 A | * | 8/2000 | Van Buskirk et al. ...... 438/697 |
| 6,440,591 B1 | * | 8/2002 | Matsunaga et al. ......... 428/699 |
| 6,940,740 B2 | * | 9/2005 | Ueda et al. ................. 365/145 |

FOREIGN PATENT DOCUMENTS

JP            2964780           8/1999

* cited by examiner

*Primary Examiner*—Hsien-Ming Lee
(74) *Attorney, Agent, or Firm*—McDermott Will & Emery LLP

(57) ABSTRACT

As a method for fabricating a semiconductor device, a lower electrode is first formed on a semiconductor substrate and then a first ferroelectric film is formed on the lower electrode by CVD using a first source gas. Thereafter, a second ferroelectric film is formed on the first ferroelectric film by CVD using a second source gas. Subsequently, an upper electrode is formed on the second ferroelectric film. In this method, the concentration of bismuth contained in the first source gas is different from the concentration of bismuth contained in the second source gas.

29 Claims, 12 Drawing Sheets

METHOD FOR FABRICATING SEMICONDUCTOR DEVICE AND SEMICONDUCTOR DEVICE

CROSS-REFERENCE TO RELATED APPLICATION

The disclosure of Japanese Patent Application No. 2003-003071 filed on Jan. 8, 2004 including specification, drawings and claims are incorporated herein by reference in its entity.

BACKGROUND OF THE INVENTION

The present invention relates to a semiconductor device including a ferroelectric film formed by CVD and a method for fabricating the same.

In recent years, further miniaturization has been demanded in the field of ferroelectric memory. With a known method in which a ferroelectric film is formed by coating, however, a ferroelectric film can be formed only on a flat underlying layer. Therefore, with the known method, there is a limitation in terms of how much the size of memory cells can be reduced. Then, to reduce the size of memory cells, a method in which a ferroelectric film is formed using thermal CVD allowing film formation on an underlying layer having level differences has been proposed.

Hereinafter, a known method for fabricating a semiconductor device will be described with reference to FIG. 15.

FIG. 15 is a flow chart showing the known method for fabricating a semiconductor device.

A lamination film of indium oxide, iridium and titanium aluminum nitride is formed on a semiconductor substrate in advance, and then a silicon oxide film is formed over the semiconductor substrate so as to cover the lamination film. Furthermore, a recess portion is formed in the silicon oxide film so that part of a surface of the lamination film is exposed through the recess portion (not shown).

Next, in Step S81, a lower electrode of a lamination film of platinum (Pt) and iridium oxide ($IrO_x$) is formed along inner surfaces of the recess portion in the silicon oxide film by sputtering.

Next, in Step S82, the lower electrode formed in Step S81 is patterned using lithography and etching.

Next, in Step S83, CVD is performed at a temperature of 350° C. and a pressure of $1.33 \times 10^2$ Pa (1 Torr) and with a gas obtained by diluting ST-1 $[Sr(Ta(OEt)_5(OC_2H_4OMe))_2]$ at a concentration of 0.1 mol % in ECH (ethylcyclohexane) flowing at a flow rate of $100 \times 10^{-3}$ ml/min, a gas obtained by diluting Bi $(MMP)_3$ at a concentration of 0.2 mol % in ECH (ethylcyclohexane) flowing at a flow rate of $200 \times 10^{-3}$ ml/min, a gas obtained by diluting PET $[Ta(OC_2H_5)_5]$ at a concentration of 0.1 mol % in ECH (ethylcyclohexane) flowing at a flow rate of $100 \times 10^{-3}$ ml/min, an oxygen ($O_2$) gas flowing at a flow rate of $1000 \times 10^{-3}$ ml/min, and an argon (Ar) gas flowing at a flow rate of $1900 \times 10^{-3}$ ml/min so that these source gases are reacted with one another for about 30 minutes. Thus, an SBT ($SrBi_2Ta_2O_9$) film to serve as a ferroelectric film is deposited so as to have a thickness of about 60 nm.

Next, in Step S84, a platinum film as an upper electrode is formed by sputtering on the SBT film formed in Step S83.

Next, in Step S85, the upper electrode formed in Step S86 is patterned using lithography and etching.

The known semiconductor device formed according to the above-described steps will be described with reference to FIG. 16.

As shown in FIG. 16, a lamination film of iridium oxide 103, iridium 102 and titanium aluminum nitride 101 is formed on a semiconductor substrate (not shown). On the semiconductor substrate, a silicon oxide film 104 is formed so as to cover the lamination film. The silicon oxide film 104 includes a recess portion 104a through which a surface of the lamination film is exposed.

Moreover, on the silicon oxide film 104 including the recess portion 104a, a lower electrode 105 of a lamination film of platinum and iridium oxide, an SBT film 106 as a ferroelectric film, and an upper electrode 107 of a platinum film are formed in this order from the bottom along inner surfaces of the recess portion 104a.

Although, as a known example of the case where a ferroelectric film is formed on a flat underlying layer by coating, a method in which a ferroelectric film is formed so as to include multiple layers has been disclosed, for example, in Japanese Patent Publication No. 2964780, any method for solving the following problems to arise in the case where a ferroelectric film is formed using CVD has not been disclosed.

With the known method for fabricating a semiconductor device and the known semiconductor, the composition of an obtained ferroelectric film can not be uniform in the film thickness direction. If the composition of a ferroelectric film is non-uniform in the film thickness direction, excellent electric characteristics of a capacitor can not be achieved.

SUMMARY OF THE INVENTION

In view of the above-described problems, the present invention has been devised. It is therefore an object of the present invention to prevent non-uniformity of the composition of a ferroelectric film in the film thickness direction, thereby providing a semiconductor device having good electric characteristics and a method for fabricating the semiconductor device.

To solve the above-described problems, the present inventors have conducted keen examinations and found that non-uniformity of the composition of a ferroelectric film in the film thickness direction is caused by heat in film formation using CVD. In view of this finding, the present invention has been devised and, specifically, a first method for fabricating a semiconductor device according to the present invention is characterized in that the method includes the steps of: forming a lower electrode on a semiconductor substrate; forming a first ferroelectric film on the lower electrode by CVD using a first source gas; forming a second ferroelectric film on the first ferroelectric film by CVD using a second source gas; and forming an upper electrode on the second ferroelectric film, and a concentration of bismuth contained in the first source gas is different from a concentration of bismuth contained in the second source gas.

According to the first inventive method for fabricating a semiconductor device, the concentration of bismuth contained in a first source gas used for CVD for forming a first ferroelectric film is different from the concentration of bismuth contained in a second source gas used for CVD for forming a second ferroelectric film. Thus, changes in the concentration of bismuth in the first ferroelectric film depending on a material for a lower electrode as an underlying layer under the first ferroelectric film can be prevented. For example, when the lower electrode is formed of a material such as platinum, with thermal diffusion of bismuth into the lower electrode due to heat in CVD taken into consideration, the concentration of bismuth contained in the first source gas is set to be higher than the concentration of bismuth contained in the second source gas. Moreover, when the lower electrode is formed of a material such as iridium oxide, in order to prevent formation of an iridium bismuth oxide compound having a high bismuth concentration at an interface between the first ferroelectric film and the lower electrode, the concentration of bismuth contained in the first source gas is set to be lower than the concentration of bismuth contained in the second source gas. Thus, non-uniformity of the bismuth concentration in each of the first and second ferroelectric films in the film thickness direction can be prevented. As a result, a semiconductor device having excellent electric characteristics can be achieved.

In the first inventive method for fabricating a semiconductor device, each of the first and second ferroelectric films is formed of a component of the same type, and the concentration of bismuth contained in the first ferroelectric film is approximately equal to the concentration of bismuth contained in the second ferroelectric film.

In this manner, if each of the first and second ferroelectric films is formed of a component of the same type, the bismuth concentration of each of the first and second ferroelectric films becomes substantially uniform in the film thickness direction.

A second method for fabricating a semiconductor device according to the present invention is characterized in that the method includes the steps of: forming a lower electrode on a semiconductor substrate; forming a first ferroelectric film on the lower electrode by CVD using a first source gas; forming a second ferroelectric film on the first ferroelectric film by CVD using a second source gas; and forming an upper electrode on the second ferroelectric film, and a concentration of oxygen contained in the first source gas is higher than a concentration of oxygen contained in the second source gas.

According to the second inventive method for fabricating a semiconductor device, the concentration of oxygen contained in a first source gas used for CVD for forming a first ferroelectric film is set to be higher than the concentration of oxygen contained in a second source gas used for CVD for forming a second ferroelectric film. Thus, reduction in a bismuth concentration in the first ferroelectric film due to thermal diffusion of bismuth into the lower electrode caused by heat in CVD can be prevented. For example, in CVD performed at a heat of about 300–350° C., film formation proceeds depending on the rate of reaction of gases. Particularly, in this case, thermal diffusion of bismuth into the lower electrode can be prevented by setting the concentration of oxygen contained in the first source gas to be higher than the concentration of oxygen contained in the second source gas, so that non-uniformity of the bismuth concentration of each of the first and second ferroelectric films in the film thickness direction can be prevented. As a result, a semiconductor device having excellent electric characteristics can be achieved.

In the second inventive method for fabricating a semiconductor device, each of the first and second ferroelectric films is formed of a component of the same type, and the concentration of bismuth contained in the first ferroelectric film is approximately equal to the concentration of bismuth contained in the second ferroelectric film.

In this manner, if each of the first and second ferroelectric films is formed of the same component, the bismuth concentration of each of the first and second ferroelectric films becomes substantially uniform in the film thickness direction.

A third method for fabricating a semiconductor device according to the present invention is characterized in that the method includes the steps of: forming a lower electrode on a semiconductor substrate; forming a first ferroelectric film on the lower electrode by CVD using a first source gas; forming a second ferroelectric film on the first ferroelectric film by CVD using a second source gas; and forming an upper electrode on the second ferroelectric film, and a concentration of tantalum contained in the first source gas is lower than a concentration of tantalum contained in the second source gas.

According to the third inventive method for fabricating a semiconductor device, the concentration of tantalum contained in a first source gas used for CVD for forming a first ferroelectric film is set to be lower than the concentration of tantalum contained in a second source gas used for CVD for forming a second ferroelectric film. Thus, increase in the tantalum concentration in the first ferroelectric film can be prevented. In the known technique, because of heat in CVD, in an initial stage of film formation, bismuth contained in the first source gas is thermally diffused into the lower electrode and a reaction of a large volume of tantalum occurs due to the diffusion. As a result, the tantalum concentration in the first ferroelectric film is increased. According to the third inventive method for fabricating a semiconductor device, the increase in the tantalum concentration can be prevented and thus non-uniformity of each of the first and second ferroelectric films in the film thickness direction can be prevented. As a result, a semiconductor device having excellent electric characteristics can be achieved.

In the third inventive method for fabricating a semiconductor device, each of the first and second ferroelectric films is formed of a component of the same type, and the concentration of tantalum contained in the first ferroelectric film is approximately equal to the concentration of tantalum contained in the second ferroelectric film.

In this manner, if each of the first and second ferroelectric films is formed of a component of the same type, the tantalum concentration of each of the first and second ferroelectric films becomes substantially uniform in the film thickness direction.

In each of the first through third inventive methods for fabricating a semiconductor device, each of the first and second ferroelectric films is preferably formed of a ferroelectric material having a bismuth layer structure.

A fourth method for fabricating a semiconductor device according to the present invention includes the steps of: forming a lower electrode on a semiconductor substrate; forming a first ferroelectric film on the lower electrode by CVD using a first source gas; forming a second ferroelectric film on the first ferroelectric film by CVD using a second source gas; and forming an upper electrode on the second ferroelectric film. In the method, each of the first and second ferroelectric films is formed of a ferroelectric material having a bismuth layer structure, a concentration of bismuth contained in the first source gas is different from a concentration of bismuth contained in the second source gas, and a concentration of tantalum contained in the first source gas is lower than a concentration of tantalum contained in the second source gas.

According to the fourth inventive method for fabricating a semiconductor device, for the same reason as that shown in description of each of the first and third methods for fabricating a semiconductor device, changes, i.e., reduction or increase in the bismuth concentration in the first ferroelectric film can be prevented and, at the same time, increase in the tantalum concentration in the first ferroelectric film can be prevented. Thus, non-uniformity of each of the bismuth and tantalum concentrations in the first and second ferroelectric films in the film thickness direction can be prevented. As a result, a semiconductor device having excellent electric characteristics can be achieved.

A fifth method for fabricating a semiconductor device according to the present invention is characterized in that the method includes the steps of: forming a lower electrode on a semiconductor substrate; forming a first ferroelectric film on the lower electrode by CVD using a first source gas; forming a second ferroelectric film on the first ferroelectric film by CVD using a second source gas; and forming an upper electrode on the second ferroelectric film, each of the first and second ferroelectric films is formed of a ferroelectric material having a bismuth layer structure, a concentration of oxygen contained in the first source gas is higher than a concentration of oxygen contained in the second source gas, and a concentration of tantalum contained in the first source gas is lower than a concentration of tantalum contained in the second source gas.

According to the fifth inventive method, for the same reason as that shown in description of each of the second and third methods for fabricating a semiconductor device, reduction in the bismuth concentration in the first ferroelectric film can be prevented and increase in the tantalum concentration in the first ferroelectric film can be also prevented. Thus, non-uniformity of each of the bismuth and tantalum concentrations in the first and second ferroelectric films in the film thickness direction can be prevented. As a result, a semiconductor device having excellent electric characteristics can be achieved.

In each of the first through fifth inventive methods for fabricating a semiconductor device, it is preferable that the inventive method further includes, before the step of forming the lower electrode on the semiconductor substrate, the step of forming an insulation film on the semiconductor substrate so as to have a recess portion, and each of the lower electrode, the first ferroelectric film, the second ferroelectric film and the upper electrode is formed along inner surfaces of the recess portion.

Thus, a semiconductor device including a solid capacitor with a ferroelectric film in which composition change is suppressed can be achieved. As a result, the present invention is conducive to reduction in the size of memory cells.

A first semiconductor device according to the present invention is characterized in that the semiconductor device includes: a lower electrode formed on a semiconductor substrate; a first ferroelectric film formed on the lower electrode; a second ferroelectric film formed on the first ferroelectric film; and an upper electrode formed on the second ferroelectric film, and a concentration of bismuth contained in the first ferroelectric film is approximately equal to a concentration of bismuth contained in the second ferroelectric film.

The first inventive semiconductor device can be obtained, for example, by the above-described first or second method for fabricating a semiconductor device and each of the ferroelectric films (i.e., the first ferroelectric film and second ferroelectric film) of the first inventive semiconductor device has a substantially uniform bismuth concentration in the film thickness direction. Therefore, a semiconductor device having excellent electric characteristics can be achieved.

A second semiconductor device according to the present invention is characterized in that the semiconductor device includes: a lower electrode formed on a semiconductor substrate; a first ferroelectric film formed on the lower electrode; a second ferroelectric film formed on the first ferroelectric film; and an upper electrode formed on the second ferroelectric film, and a concentration of tantalum contained in the first ferroelectric film is approximately equal to a concentration of tantalum contained in the second ferroelectric film.

The second inventive semiconductor device can be obtained, for example, by the above-described third method for fabricating a semiconductor device and each of the ferroelectric films (i.e., the first ferroelectric film and second ferroelectric film) of the second inventive semiconductor device has a substantially uniform tantalum concentration in the film thickness direction. Therefore, a semiconductor device having excellent electric characteristics can be achieved.

In the first or second inventive semiconductor device, each of the first and second ferroelectric films is preferably formed of a ferroelectric material having a bismuth layer structure.

A third semiconductor device according to the present invention is characterized in that the semiconductor device includes: a lower electrode formed on a semiconductor substrate; a first ferroelectric film formed on the lower electrode; a second ferroelectric film formed on the first ferroelectric film; and an upper electrode formed on the second ferroelectric film, each of the first and second ferroelectric films is formed of a ferroelectric material having a bismuth layer structure, a concentration of bismuth contained in the first ferroelectric film is approximately equal to a concentration of bismuth contained in the second ferroelectric film, and a concentration of tantalum contained in the first ferroelectric film is approximately equal to a concentration of tantalum contained in the second ferroelectric film.

The inventive third semiconductor device can be obtained, for example, by a combination of the above-described first or second method for fabricating a semiconductor device and the above-described third method for fabricating a semiconductor device and each of the ferroelectric films (i.e., the first ferroelectric film and second ferroelectric film) of the third inventive semiconductor device has a substantially uniform tantalum concentration in the film thickness direction. Therefore, a semiconductor device having excellent electric characteristics can be achieved.

In each of the first through third semiconductor devices, each of the lower electrode, the first ferroelectric film, the second ferroelectric film and the upper electrode is preferably formed along inner surfaces of a recess portion in an insulation film formed on the semiconductor substrate.

Thus, a semiconductor device including a solid capacitor with a ferroelectric film in which composition change is suppressed can be achieved. As a result, the present invention is conducive to reduction in the size of memory cells.

As has been described, with each of the inventive first through fifth methods for fabricating a semiconductor device and the inventive first through third semiconductor devices, the composition of a ferroelectric film can be substantially uniform in the film thickness direction. Therefore, a semiconductor device including a capacitor with excellent electric characteristics can be achieved.

DESCRIPTION OF THE PREFERRED EMBODIMENTS

Hereinafter, each embodiment of the present invention will be described with reference to the accompanying drawings.

(First Embodiment)

Hereinafter, a method for fabricating a semiconductor device according to a first embodiment of the present invention will be described with reference to FIG. 1.

Figure 1:
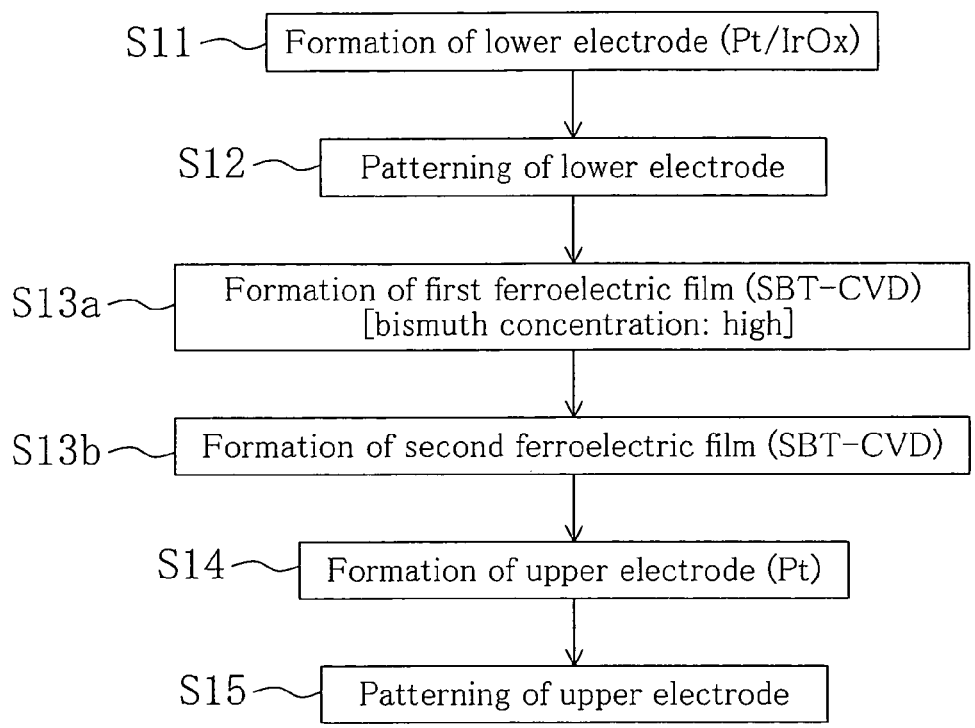
FIG. 1 is a flow chart showing a method for fabricating a semiconductor device according to a first embodiment of the present invention.

FIG. 1 is a flow chart showing a method for fabricating a semiconductor device according to the first embodiment of the present invention.

A lamination film of indium oxide, iridium and titanium aluminum nitride is formed on a semiconductor substrate in advance, and then a silicon oxide film is formed over the semiconductor substrate so as to cover the lamination film. Furthermore, a recess portion is formed in the silicon oxide film so that part of a surface of the lamination film is exposed through the recess portion (not shown).

Next, in Step S11, a lower electrode formed of a platinum (Pt) film is formed along inner surfaces of the recess portion in the silicon oxide film by sputtering. Note that the lower electrode may be formed of a lamination film of platinum (Pt) and iridium oxide ($IrO_x$).

Next, in Step S12, the lower electrode formed in Step S11 is patterned using lithography and etching.

Next, in Step S13$a$, using CVD, an SBT ($SrBi_2Ta_2O_9$) film to serve as a first ferroelectric film is deposited to a thickness of about 20 nm on the lower electrode patterned in Step S12. In this step, the first ferroelectric film is formed at a temperature of 350° C. and a pressure of $1.33 \times 10^2$ Pa (1 Torr), with a gas obtained by diluting ST-1 [$Sr(Ta(OEt)_5(OC_2H_4OMe))_2$] at a concentration of 0.1 mol % in ECH (ethylcyclohexane) flowing at a flow rate of $100 \times 10^{-3}$ ml/min, a gas obtained by diluting $Bi(MMP)_3$ at a concentration of 0.2 mol % in ECH (ethylcyclohexane) flowing at a flow rate of $220 \times 10^{-3}$ ml/min, a gas obtained by diluting PET [$Ta(OC_2H_5)_5$] at a concentration of 0.1 mol % in ECH (ethylcyclohexane) flowing at a flow rate of $100 \times 10^{-3}$ ml/min, an oxygen ($O_2$) gas flowing at a flow rate $1000 \times 10^{-3}$ ml/min, and an argon (Ar) gas flowing at a flow rate of $1900 \times 10^{-3}$ ml/min, and by bringing these source gases in reaction with one another for about 10 minutes.

Next, in Step S13$b$, using CVD, an SBT ($SrBi_2Ta_2O_9$) film to serve as a second ferroelectric film is deposited to a thickness of about 40 nm on the first ferroelectric film formed in Step S13$a$. In this step, the second ferroelectric film is formed at a temperature of 350° C. and a pressure of $1.33 \times 10^2$ Pa (1 Torr), with a gas obtained by diluting ST-1 [$Sr(Ta(OEt)_5(OC_2H_4OMe))_2$] at a concentration of 0.1 mol % in ECH (ethylcyclohexane) flowing at a flow rate of $100 \times 10^{-3}$ ml/min, a gas obtained by diluting Bi ($MMP)_3$ at a concentration of 0.2 mol % in ECH (ethylcyclohexane) flowing at a flow rate of $200 \times 10^{-3}$ ml/min, a gas obtained by diluting PET [$Ta(OC_2H_5)_5$] at a concentration of 0.1 mol % in ECH (ethylcyclohexane) flowing at a flow rate of $100 \times 10^{-3}$ ml/min, an oxygen ($O_2$) gas flowing at a flow rate $1000 \times 10^{-3}$ ml/min, and an argon (Ar) gas flowing at a flow rate of $1900 \times 10^{-3}$ ml/min, and by bringing these source gases in reaction with one another for about 20 minutes.

In this case, as has been described, the flow rate of the gas obtained by diluting $Bi(MMP)_3$ in ECH is set to be $220 \times 10^{-3}$ ml/min for a growth condition for the first ferroelectric film in Step S13$a$ and the flow rate of the gas obtained by diluting $Bi(MMP)_3$ in ECH is set to be $200 \times 10^{-3}$ ml/min for a growth condition for the second ferroelectric film in Step S13$b$. In this manner, the concentration of bismuth contained in a CVD gas used for forming the first ferroelectric film is higher than the concentration of bismuth contained in a CVD gas used for forming the second ferroelectric film.

Next, in Step S14, an upper electrode of a platinum film is formed by sputtering on the second ferroelectric film formed in Step S13$b$.

Next, in Step S15, the upper electrode formed in Step S14 is patterned using lithography and etching.

A semiconductor device according to the first embodiment of the present invention formed following the above-described steps will be described with reference to FIG. 2.

Figure 2:
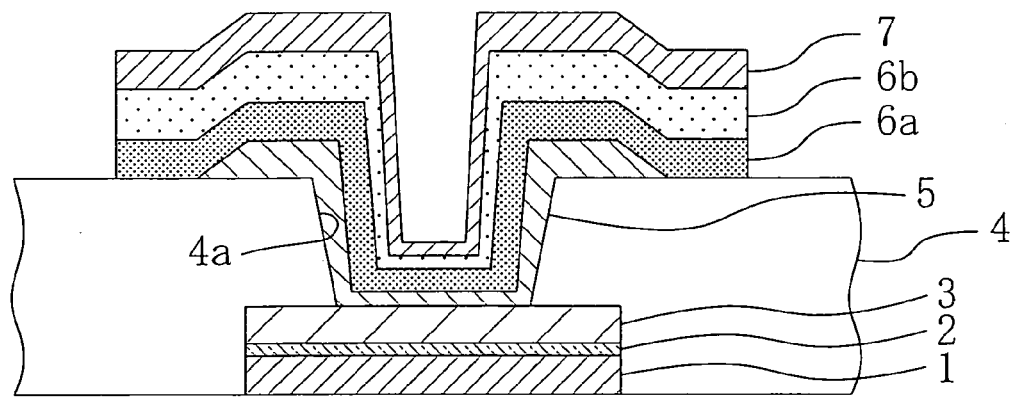
FIG. 2 is a cross-sectional view illustrating the structure of a semiconductor device of the first embodiment of the present invention.

FIG. 2 is a cross-sectional view illustrating the structure of a semiconductor device of the first embodiment of the present invention.

As shown in FIG. 2, on a semiconductor substrate (not shown), a lamination film of iridium oxide 3, iridium 2 and titanium aluminum nitride 1 is formed and a silicon oxide film 4 is formed so as to cover the lamination film. The silicon oxide film 4 includes a recess portion 4a through which part of a surface of the lamination film is exposed.

Moreover, on the silicon oxide film 4 including the recess portion 4a, a lower electrode 5 of a platinum (Pt) film, a first ferroelectric film 6a of an SBT film, a second ferroelectric film 6b of an SBT film, and an upper electrode 7 of a platinum film are formed in this order from the bottom along inner surfaces of the recess portion 4a. Note that the lower electrode may be formed of a lamination film of platinum (Pt) and iridium oxide ($IrO_x$).

In this case, the composition ratio of Sr (strontium):Bi (bismuth) is substantially 1:2.24 in each of the first ferroelectric film 6a and the second ferroelectric film 6b. The concentration of bismuth in the first ferroelectric film 6a and the concentration of bismuth in the second ferroelectric film 6b are substantially the same.

Hereinafter, the reason why in the first embodiment of the present invention, the concentration of bismuth contained in a CVD gas used for forming the first ferroelectric film 6a is set to be higher than the concentration of bismuth contained in a CVD gas used for forming the second ferroelectric film 6b will be described.

As a result of various observations, it has been found that because of non-uniformity of the composition of the ferroelectric film formed by CVD in the film thickness direction, polarization characteristics of a capacitor including a ferroelectric film formed by the known method for fabricating a semiconductor device using CVD are not good, compared to polarization characteristics of a capacitor including a ferroelectric film formed by coating.

Figure 3:
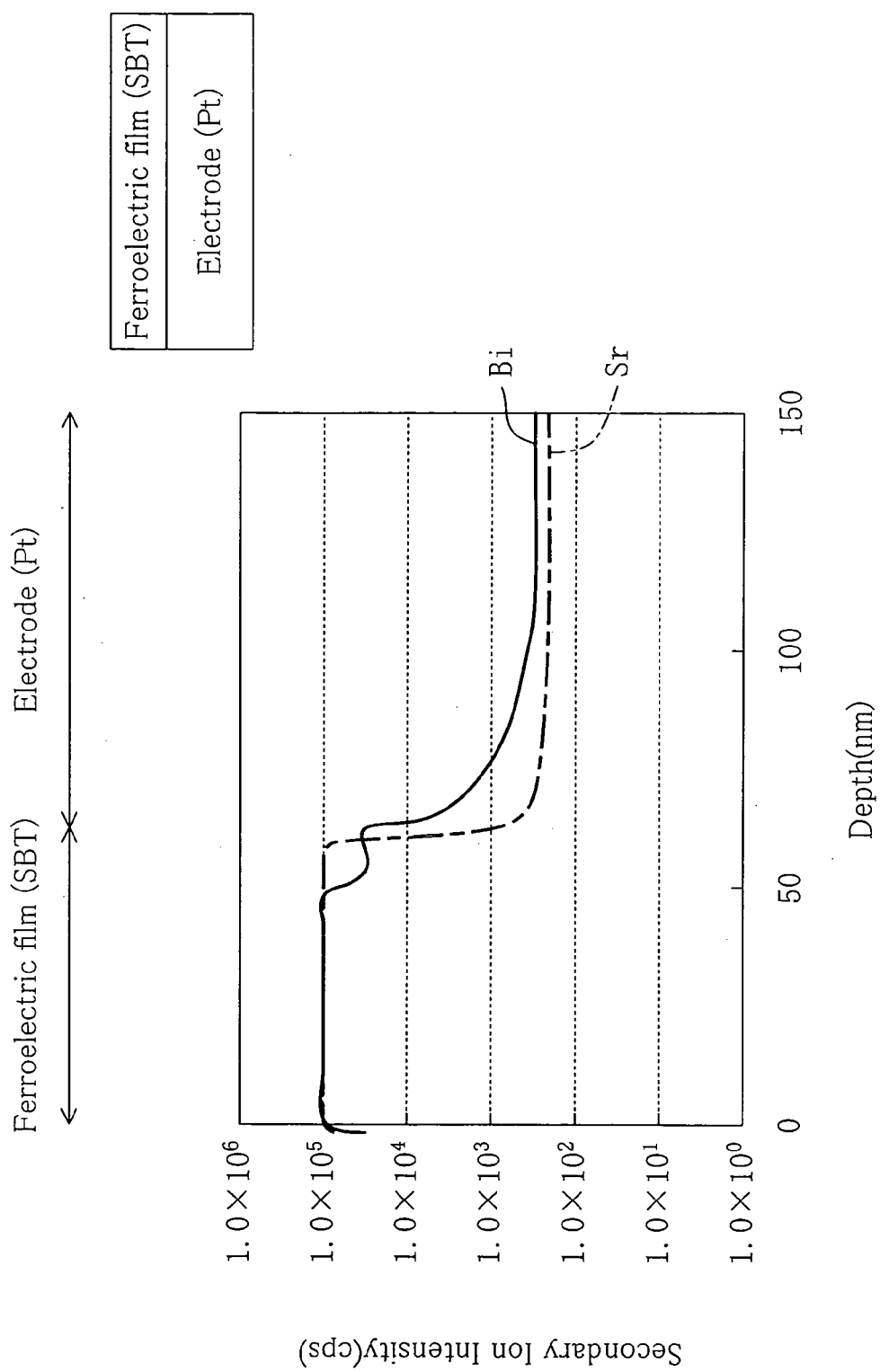
FIG. 3 is a graph showing bismuth distribution in the film thickness direction in a general SBT film formed using CVD.
Figure 4:
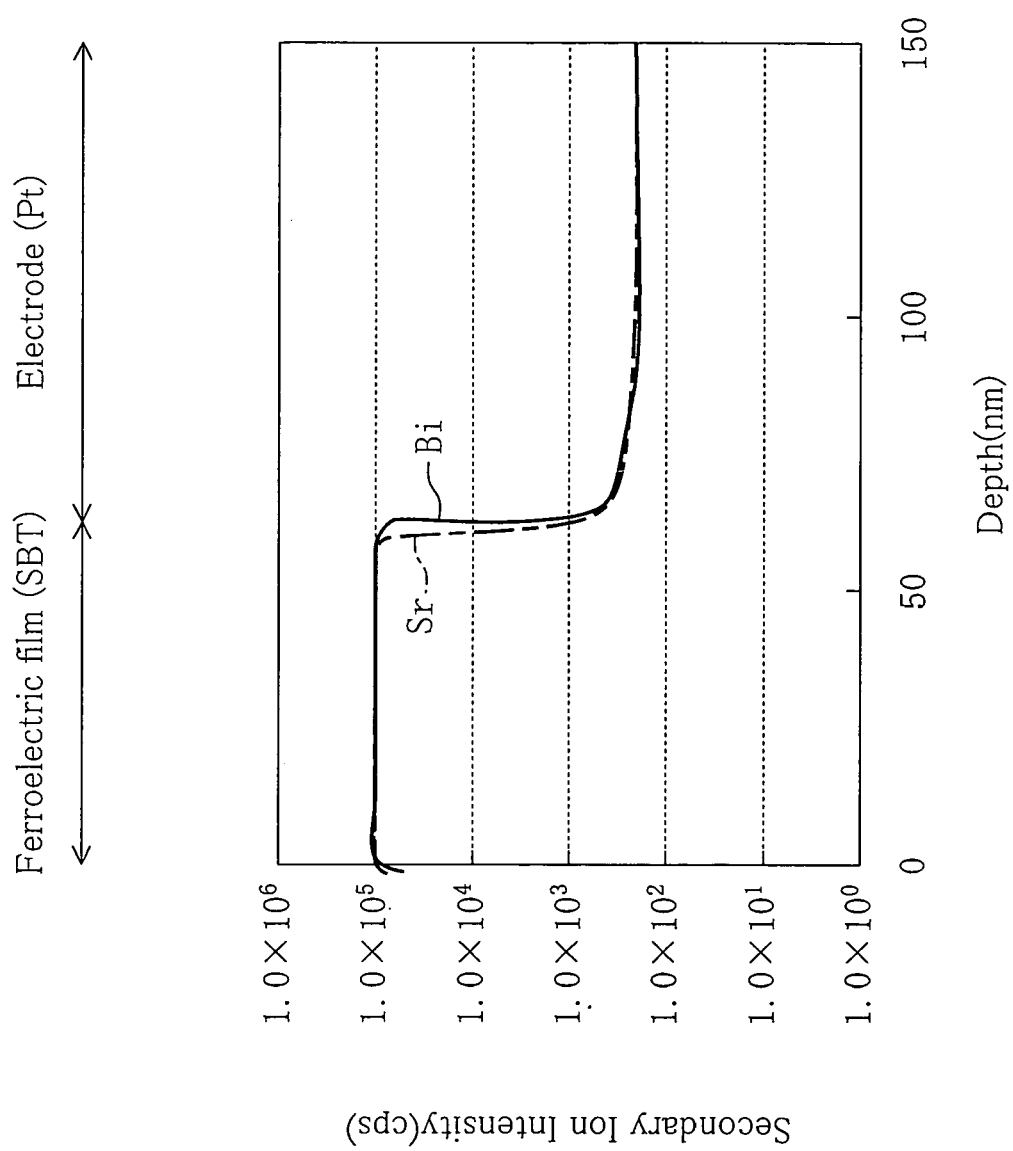
FIG. 4 is a graph showing bismuth distribution in the film thickness direction in a general SBT film formed using coating.

FIG. 3 is a graph showing results of SIMS analysis of bismuth distribution in the film thickness direction in a ferroelectric film of an SBT film formed on an electrode of a platinum film using regular CVD. FIG. 4 is a graph showing results of SIMS analysis of bismuth distribution in the film thickness direction in a ferroelectric film of an SBT film formed on an electrode of a platinum film using regular coating. Note that in FIGS. 3 and 4, a standardized strontium concentration in the ferroelectric film is also shown.

First, as clearly shown in FIG. 3, the SBT film formed using regular CVD exhibits the following characteristics. In part of the SBT film extending from an upper surface of the platinum film by about 10–20 nm, i.e., part of the SBT film close to the platinum film, the bismuth concentration is about half of the bismuth concentration in other parts of the SBT film. Thus, the bismuth concentration in the SBT film is very non-uniform in the film thickness direction of the SBT film.

On the other hand, as clearly shown in FIG. 4, in the SBT film formed using regular coating, no part in which the bismuth concentration is non-uniform is seen. That is, the bismuth concentration in the SBT film is uniform in the film thickness direction of the SBT film.

As described above, it has been found that the concentration of bismuth in a ferroelectric film formed using regular CVD is non-uniform in the film thickness direction because of heat itself generated when the ferroelectric film is formed using CVD. Hereinafter, this will be specifically described.

Normally, in CVD, a ferroelectric film is formed by bringing CVD gases into reaction with one another with a heat of about 300–400° C. In an initial stage of film formation, bismuth is thermally diffused into the electrode of a platinum film as an underlying layer. This is considered to be the reason why the bismuth concentration is lower in a lower part of the obtained SBT film. This is also supported by fact that the bismuth concentration is reduced in an upper part of the electrode of a platinum film. On the other hand, normally in coating, a temperature when coating is performed is substantially room temperature and it is therefore considered that bismuth is hardly thermally diffused into an electrode of a platinum film.

Therefore, in the first embodiment of the present invention, in the view that bismuth is easily thermally diffused into the electrode as an underlying layer in an initial stage of forming a ferroelectric film, the first ferroelectric film 6a is formed using a CVD gas of which the bismuth concentration is increased by an amount of bismuth diffused in the lower electrode 5 as an underlying layer and also the second ferroelectric film 6b is formed using a CVD gas normally used and having a lower bismuth concentration than the concentration of bismuth in a CVD used to form the first ferroelectric film 6a. This is a characteristic of the first embodiment of the present invention.

Figure 5:
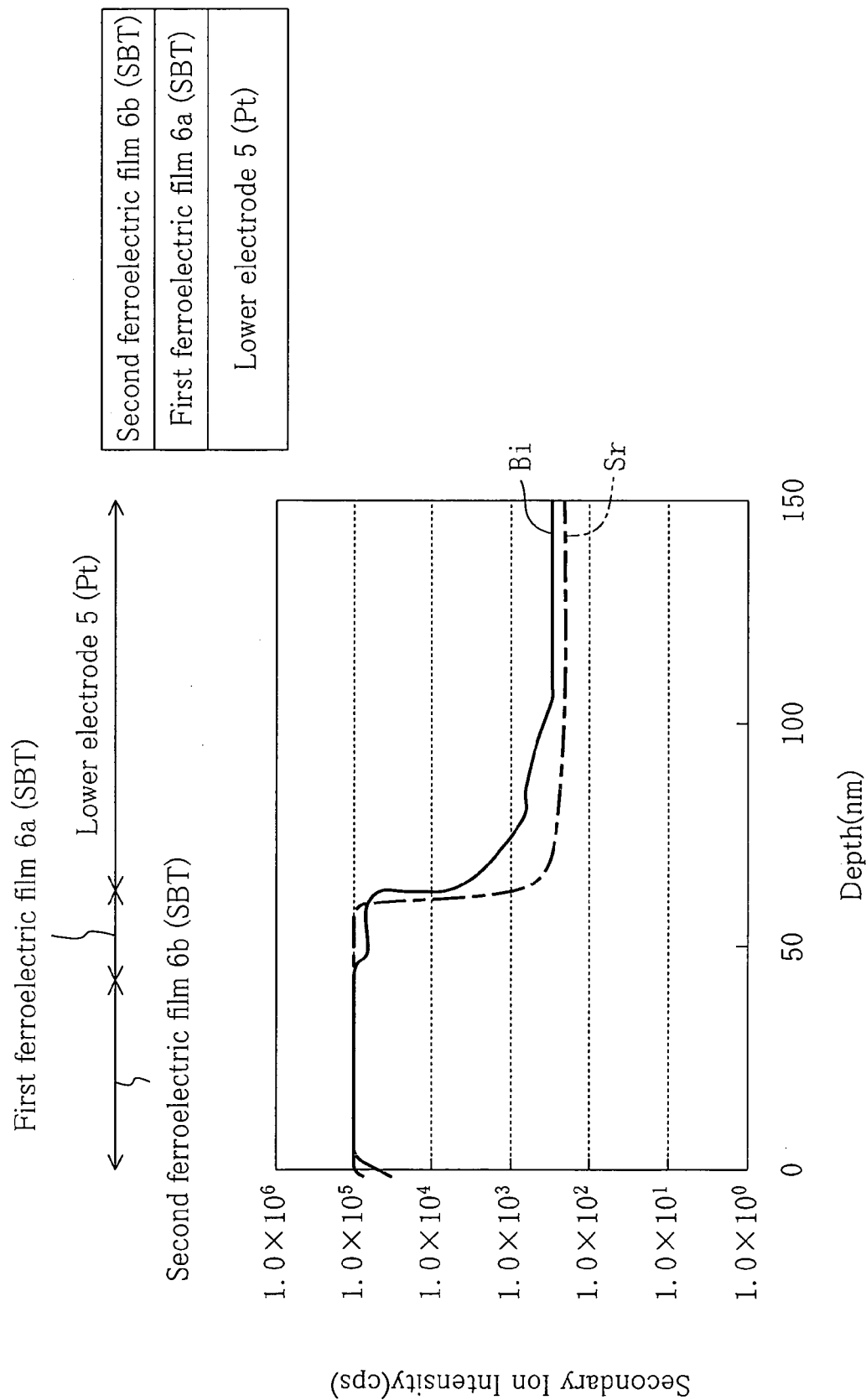
FIG. 5 is a graph showing bismuth distribution in the film thickness direction in the first and second ferroelectric films formed using the method for fabricating a semiconductor device according to the first embodiment of the present invention.

FIG. 5 is a graph showing results of SIMS analysis of bismuth concentration distribution in the film thickness direction for the first and second ferroelectric films 6a and 6b in the first embodiment of the present invention. Note that in FIG. 5, a standardized strontium concentration distribution in the first and second ferroelectric films 6a and 6b is also shown.

As clearly shown in FIG. 5, it is confirmed that in upper part of the lower electrode 5 of a platinum film, bismuth is thermally diffused from the first ferroelectric film 6a. It is also shown that the bismuth concentrations of the first and second ferroelectric films 6a and 6b are substantially the same. That is, in the first and second ferroelectric films 6a and 6b of the first embodiment of the present invention, uniformity in the bismuth concentration in the film thickness direction is largely improved, compared to the case shown in FIG. 3.

Now, electric characteristics of each of the semiconductor device of the first embodiment of the present invention and the semiconductor device of the known example will be described. Needless to say, a solid capacitor described later is formed through desired fabrication process steps such as thermal treatment and processing process.

By obtaining the Pnv value of a solid capacitor constituting the semiconductor device of the first embodiment of the present invention and also the Pnv value of a solid capacitor constituting the semiconductor device of the known example, electric characteristics of each of the solid capacitors were evaluated. The obtained Pnv value for the first embodiment of the present invention was 12.1. In contrast, the obtained Pnv value for the known example was 9.9. Note that the greater the Pnv value (polarization) of a capacitor is, the more excellent electric characteristics the capacitor has. As clearly understood from the obtained Pnv values, electric characteristics of the semiconductor device of the first embodiment of the present invention were largely improved, compared to electric characteristics of the semiconductor device of the known example. The reason why the above-described results were obtained is as follows.

In the known example, the concentration of bismuth in the lower part of the ferroelectric film was reduced, and thus characteristics as a ferroelectric film were not sufficiently exhibited in the part. In the first embodiment of the present invention, however, the first ferroelectric film 6a of the lower part of the ferroelectric film including the first and second ferroelectric films 6a and 6b still had a sufficient bismuth concentration, compared to the known example, even after bismuth was diffused in the underlying lower electrode 5. It is therefore considered that electric characteristics of the semiconductor device including the first and second ferroelectric films 6a and 6b according to the first embodiment were improved, compared to electric characteristics of the semiconductor device of the known example.

Note that in the first embodiment of the present invention, the case where a ferroelectric film of an SBT film is formed by CVD has been described. However, even when an SBTN film containing Nb is formed by CVD or when a ferroelectric film, such as a BLT film, having a bismuth layer structure is formed by CVD, the same effects as those described above can be achieved.

Moreover, in the first embodiment of the present invention, the case where a ferroelectric film is formed by thermal CVD has been described. However, even if a ferroelectric film is formed by some other CVD technique, such as plasma CVD, which is performed by applying heat, the same effects as those described above can be achieved.

(Second Embodiment)

Hereinafter, a method for fabricating a semiconductor device according to a second embodiment of the present invention will be described with reference to FIG. 6.

Figure 6:
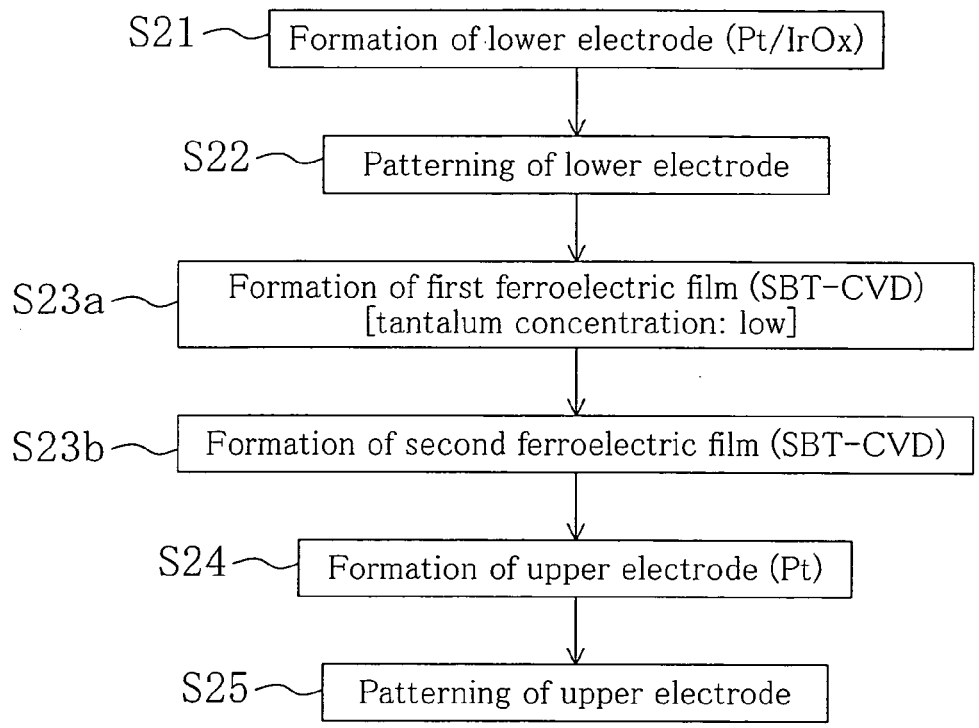
FIG. 6 is a flow chart showing a method for fabricating a semiconductor device according to a second embodiment of the present invention.

FIG. 6 is a flow chart showing a method for fabricating a semiconductor device of the second embodiment of the present invention.

A lamination film of indium oxide, iridium and titanium aluminum nitride is formed on a semiconductor substrate in advance, and then a silicon oxide film is formed over the semiconductor substrate so as to cover the lamination film. Furthermore, a recess portion is formed in the silicon oxide film so that part of a surface of the lamination film is exposed through the recess portion (not shown).

Next, in Step S21, a lower electrode formed of a platinum (Pt) film is formed along inner surfaces of the recess portion in the silicon oxide film by sputtering. Note that the lower electrode may be formed of a lamination film of platinum (Pt) and iridium oxide ($IrO_x$).

Next, in Step S22, the lower electrode formed in Step S21 is patterned using lithography and etching.

Next, in Step S23a, using CVD, an SBT ($SrBi_2Ta_2O_9$) film to serve as a first ferroelectric film is deposited to a thickness of about 20 nm on the lower electrode patterned in Step S22. In this step, the first ferroelectric film is formed at a temperature of 350° C. and a pressure of $1.33 \times 10^2$ Pa (1 Torr), with a gas obtained by diluting ST-1 [$Sr(Ta(OEt)_5(OC_2H_4OMe))_2$] at a concentration of 0.1 mol % in ECH (ethylcyclohexane) flowing at a flow rate of $100 \times 10^{-3}$ ml/min, a gas obtained by diluting Bi $(MMP)_3$ at a concentration of 0.2 mol % in ECH (ethylcyclohexane) flowing at a flow rate of $200 \times 10^{-3}$ ml/min, a gas obtained by diluting PET [$Ta(OC_2H_5)_5$] at a concentration of 0.1 mol % in ECH (ethylcyclohexane) flowing at a flow rate of $90 \times 10^{-3}$ ml/min, an oxygen ($O_2$) gas flowing at a flow rate $1000 \times 10^{-3}$ ml/min, and an argon (Ar) gas flowing at a flow rate of $1900 \times 10^{-3}$ ml/min, and by bringing these source gases in reaction with one another for about 10 minutes.

Next, in Step S23b, using CVD, an SBT ($SrBi_2Ta_2O_9$) film to serve as a second ferroelectric film is deposited to a thickness of about 40 nm on the first ferroelectric film formed in Step S23a. In this step, the second ferroelectric film is formed at a temperature of 350° C. and a pressure of $1.33 \times 10^2$ Pa (1 Torr), with a gas obtained by diluting ST-1 [$Sr(Ta(OEt)_5(OC_2H_4OMe))_2$] at a concentration of 0.1 mol % in ECH (ethylcyclohexane) flowing at a flow rate of $100 \times 10^{-3}$ ml/min, a gas obtained by diluting Bi $(MMP)_3$ at a concentration of 0.2 mol % in ECH (ethylcyclohexane) flowing at a flow rate of $200 \times 10^{-3}$ ml/min, a gas obtained by diluting PET [$Ta(OC_2H_5)_5$] at a concentration of 0.1 mol % in ECH (ethylcyclohexane) flowing at a flow rate of $100 \times 10^{-1}$ ml/min, an oxygen ($O_2$) gas flowing at a flow rate $1000 \times 10^{-3}$ ml/min, and an argon (Ar) gas flowing at a flow rate of $1900 \times 10^{-3}$ ml/min, and by bringing these source gases in reaction with one another for about 20 minutes.

In this case, as has been described, the flow rate of the gas obtained by diluting PET [$Ta(OC_2H_5)_5$] in ECH is set to be $90 \times 10^{-3}$ ml/min for a growth condition for the first ferroelectric film in Step S23a and the flow rate of the gas obtained by diluting PET [$Ta(OC_2H_5)_5$] in ECH is set to be $100 \times 10^{-3}$ ml/min for a growth condition for the second ferroelectric film in Step S23b. In this manner, the concentration of tantalum contained in a CVD gas used for forming the first ferroelectric film is lower than the concentration of tantalum contained in a CVD gas used for forming the second ferroelectric film.

Next, in Step S24, an upper electrode of a platinum film is formed by sputtering on the second ferroelectric film formed in Step S23b.

Next, in Step S25, the upper electrode formed in Step S24 is patterned using lithography and etching.

Figure 7:
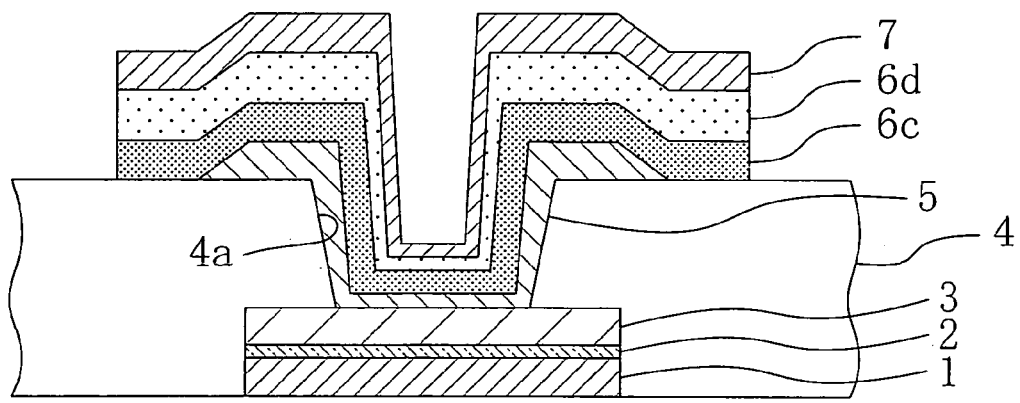
FIG. 7 is a cross-sectional view illustrating the structure of the semiconductor device of the second embodiment of the present invention.

FIG. 7 is a cross-sectional view illustrating the structure of the semiconductor device of the second embodiment of the present invention.

As shown in FIG. 7, on a semiconductor substrate (not shown), a lamination film of iridium oxide 3, iridium 2 and titanium aluminum nitride 1 is formed and a silicon oxide film 4 is formed so as to cover the lamination film. The silicon oxide film 4 includes a recess portion 4a through which part of a surface of the lamination film is exposed.

Moreover, on the silicon oxide film 4 including the recess portion 4a, a lower electrode 5 of a platinum film, a first ferroelectric film 6c of an SBT film, a second ferroelectric film 6d of an SBT film, and an upper electrode 7 of a platinum film are formed in this order from the bottom along inner surfaces of the recess portion 4a. Note that the lower electrode 5 may be formed of a lamination film of platinum (Pt) and iridium oxide ($IrO_x$).

In this case, the composition ratio of Sr (strontium):Ta (tantalum) is substantially 1:2 in each of the first ferroelectric film 6c and the second ferroelectric film 6d. The concentration of tantalum in the first ferroelectric film 6c and the concentration of tantalum in the second ferroelectric film 6d are substantially the same.

Hereinafter, the reason why in the second embodiment of the present invention, the concentration of tantalum contained in a CVD gas used for forming the first ferroelectric film 6c is set to be lower than the concentration of tantalum contained in a CVD gas used for forming the second ferroelectric film 6d will be described.

Figure 8:
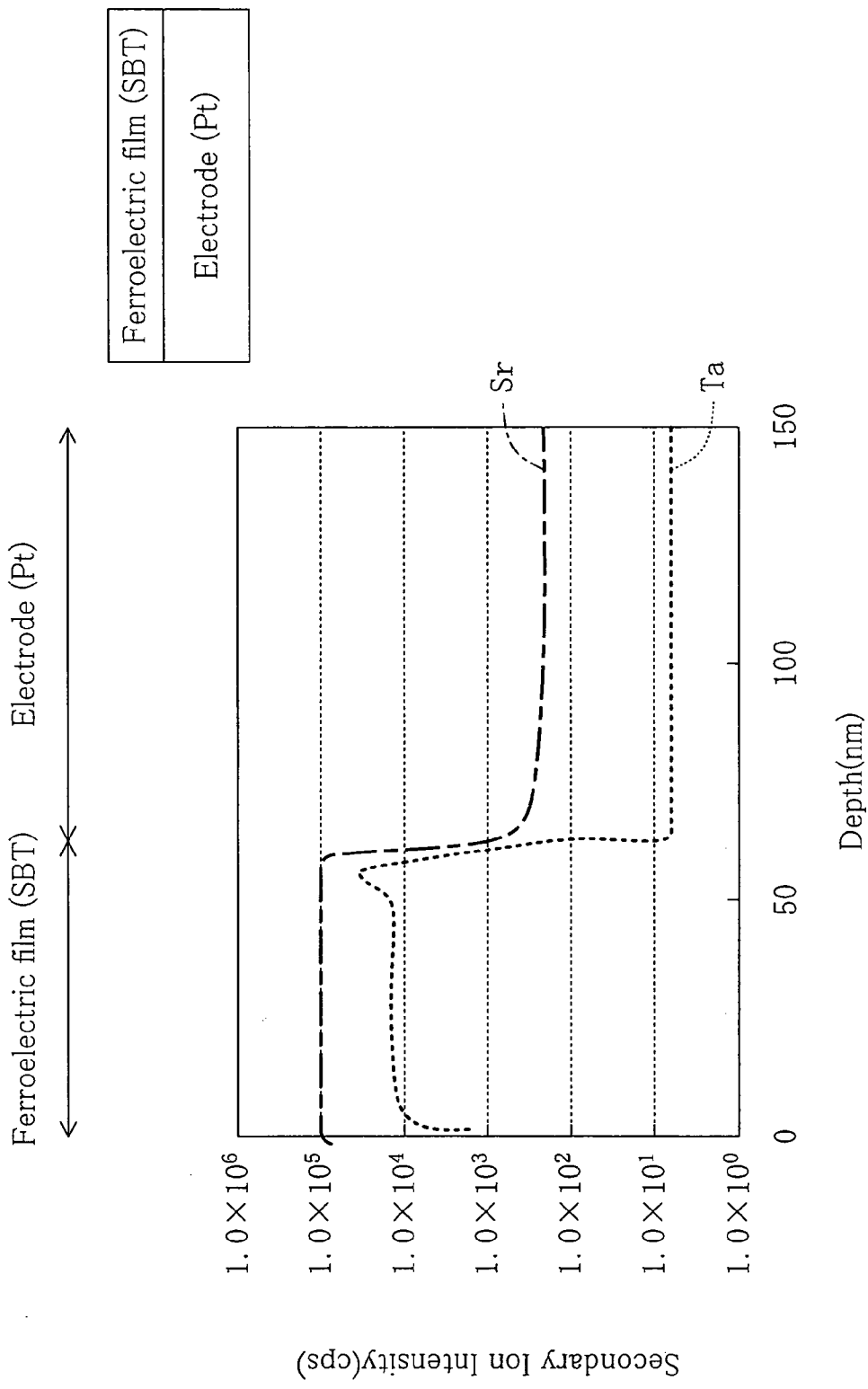
FIG. 8 is a graph showing tantalum distribution in the film thickness direction in a general SBT film formed using CVD.
Figure 9:
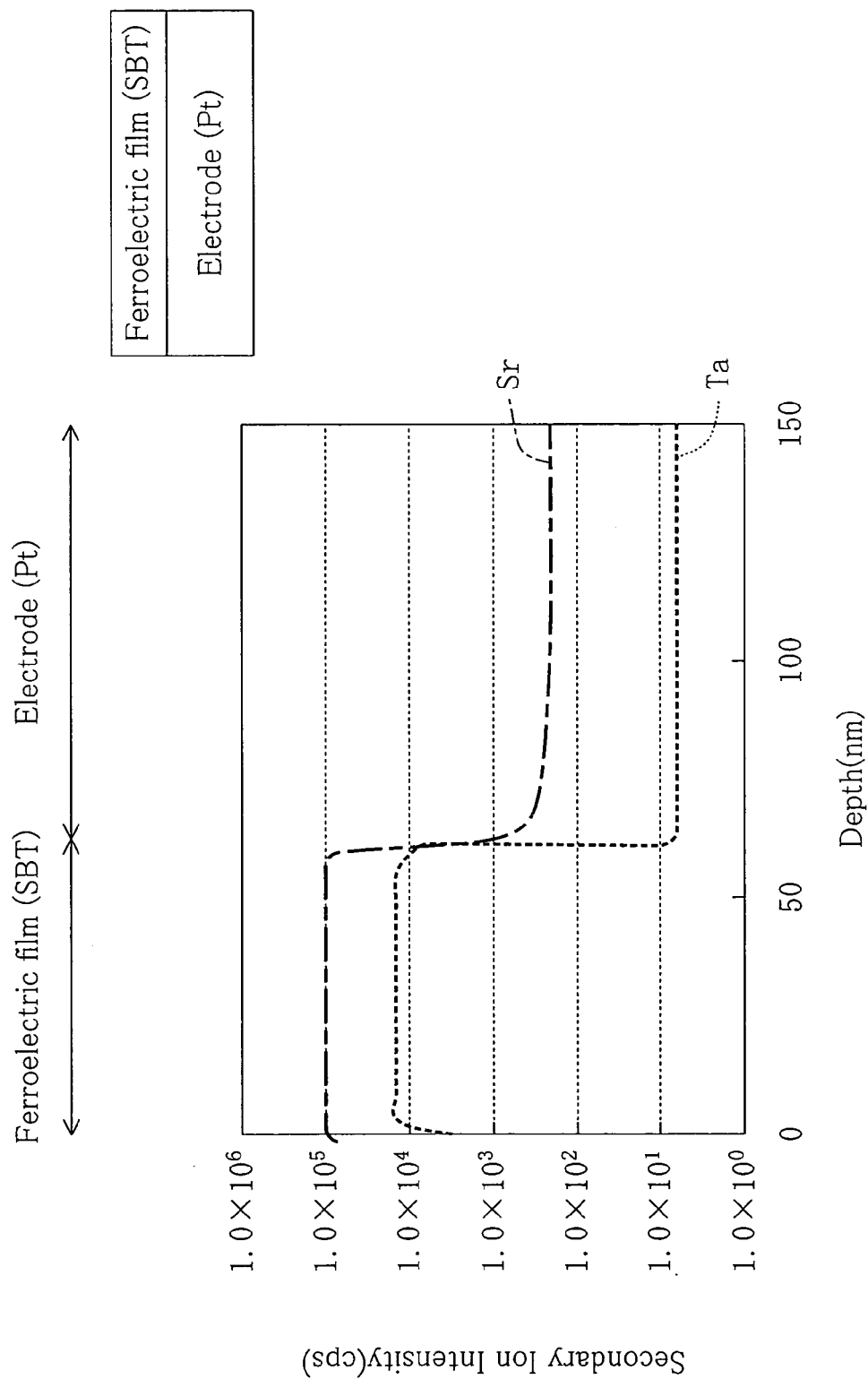
FIG. 9 is a graph showing tantalum distribution in the film thickness direction in a general SBT film formed using coating.

FIG. 8 is a graph showing results of SIMS analysis of tantalum concentration distribution in the film thickness direction in a ferroelectric film of an SBT film formed on an electrode of a platinum film using regular CVD. FIG. 9 is a graph showing results of SIMS analysis of tantalum distribution in the film thickness direction in a ferroelectric film of an SBT film formed on an electrode of a platinum film using regular coating. Note that in each of FIGS. 8 and 9, a standardized strontium concentration in each of the ferroelectric film is also shown.

First, as clearly shown in FIG. 8, the SBT film formed using regular CVD exhibits the following characteristics. In part of the SBT film extending from an upper surface of the platinum film by about 10–20 nm, i.e., part of the SBT film close to the platinum film, the concentration of tantalum is about twice of the concentration of tantalum in other parts of the SBT film. Thus, the concentration of tantalum in the SBT film is very non-uniform in the film thickness direction of the SBT film.

On the other hand, as clearly shown in FIG. 9, in the SBT film formed using regular coating, no part in which the concentration of tantalum is non-uniform is seen. That is, the concentration of tantalum in the SBT film is uniform in the film thickness direction of the SBT film.

As described above, as a result of keen examinations, it has been found that the concentration of tantalum in a ferroelectric film formed using regular CVD is non-uniform in the film thickness direction mainly because of heat itself generated when the ferroelectric film is formed using CVD and also thermal diffusion of bismuth due to the heat. Hereinafter, this will be specifically described.

Normally, in CVD, a ferroelectric film is formed by bringing CVD gases into reaction with one another with a heat of about 300–400° C. In an initial stage of film formation, as also described in the first embodiment, bismuth is thermally diffused into the electrode of a platinum film as an underlying layer. Because of this, in a vapor phase bismuth is reduced, so that strontium and tantalum in reaction are increased according to a reduction amount of bismuth. This is considered to be a reason for increase in the concentration of tantalum in the lower part of the obtained SBT film. On the other hand, normally, in coating, a temperature when coating is performed is substantially room temperature. Thus, bismuth is hardly thermally diffused into an electrode of a platinum film. It is therefore considered that the concentration of tantalum in a ferroelectric film does not vary because bismuth is hardly thermally diffused.

Therefore, in the view that bismuth is easily thermally diffused into the electrode as an underlying layer in an initial stage of forming a ferroelectric film, the second embodiment of the present invention has been devised. In the second embodiment, since tantalum in reaction is increased according to an amount of bismuth diffused in the lower electrode 5 as an underlying layer, the first ferroelectric film 6c is formed using a CVD gas of which the tantalum concentration is reduced according to the amount of diffused bismuth and also the second ferroelectric film 6d is formed using a CVD gas normally used and having a higher tantalum concentration than the concentration of tantalum in a CVD used to form the first ferroelectric film 6c. This is a characteristic of the second embodiment of the present invention.

Figure 10:
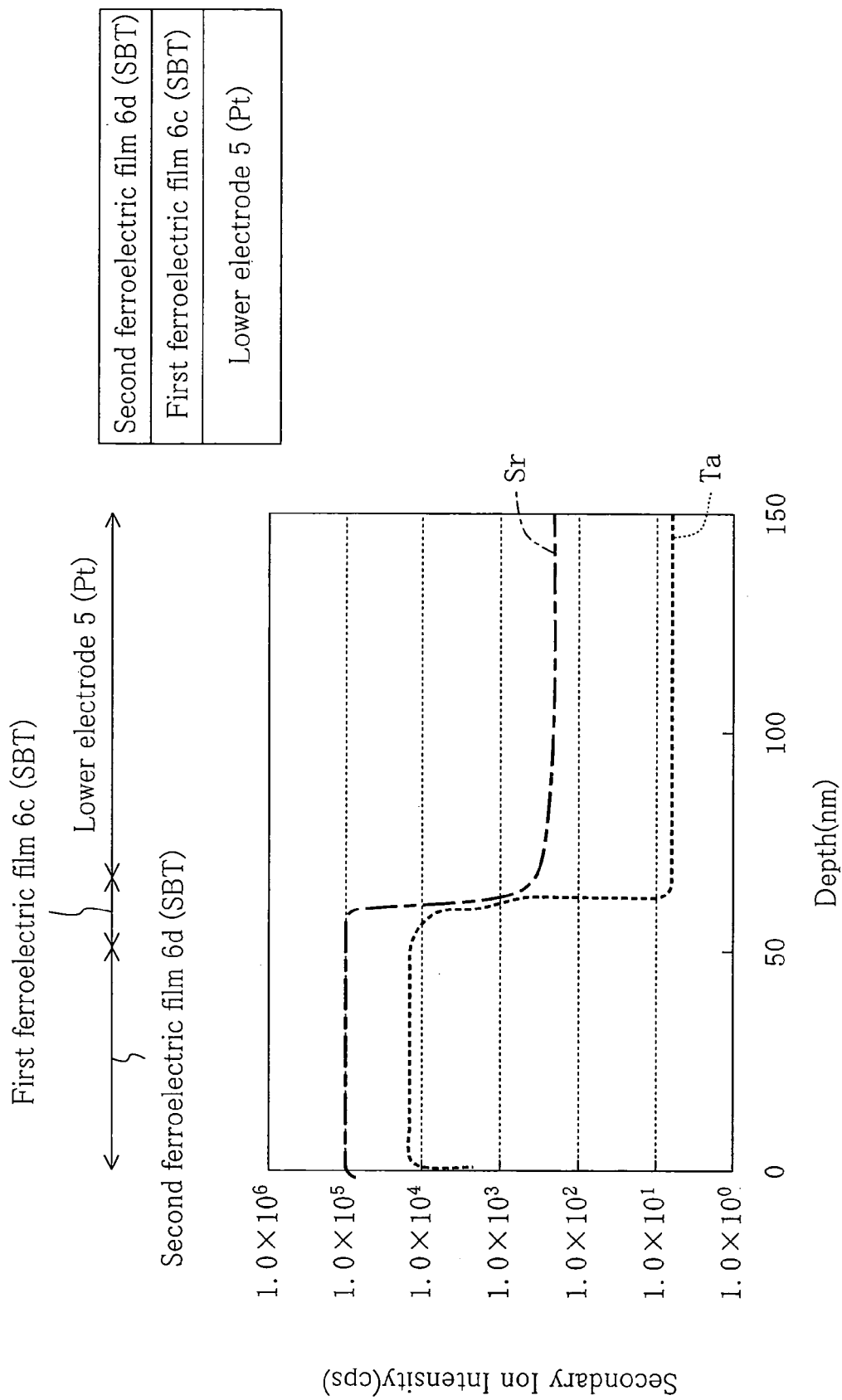
FIG. 10 is a graph showing tantalum distribution in the film thickness direction in the first and second ferroelectric films formed using the method for fabricating a semiconductor device according to the second embodiment of the present invention.

FIG. 10 is a graph showing results of SIMS analysis of tantalum concentration distribution in the film thickness direction for the first and second ferroelectric films 6c and 6d of the second embodiment of the present invention. Note that in FIG. 10, a standardized strontium concentration distribution in the first and second ferroelectric films 6c and 6d is also shown.

As clearly shown in FIG. 10, the tantalum concentrations of the first and second ferroelectric films 6c and 6d are substantially the same. That is, in the first and second ferroelectric films 6c and 6d of the second embodiment of the present invention, uniformity in the concentration of tantalum in the film thickness direction is largely improved, compared to the case shown in FIG. 8.

Now, electric characteristics of each of the semiconductor device of the second embodiment of the present invention and the semiconductor device of the known example will be described. Needless to say, a solid capacitor described later is formed through desired fabrication process steps such as thermal treatment and processing process.

By obtaining the Pnv value of a solid capacitor constituting the semiconductor device of the second embodiment of the present invention and also the Pnv value of a solid capacitor constituting the semiconductor device of the known example, electric characteristics of each of the solid capacitors were evaluated. The obtained Pnv value for the second embodiment of the present invention was more favorable than the obtained Pnv value for the known example. Note that the greater the Pnv value (polarization) of a capacitor is, the more excellent electric characteristics the capacitor has. The reason why the above-described results were obtained is as follows.

In the known example, the concentration of bismuth in the lower part of the ferroelectric film was increased, and thus characteristics as a ferroelectric film were not sufficiently exhibited in the part. In the second embodiment of the present invention, however, when the first ferroelectric film 6c of the lower part of the ferroelectric film including the first and second ferroelectric films 6c and 6d was formed, the concentration of tantalum in a vapor phase was set to be low. Thus, even after bismuth was diffused in the underlying lower electrode 5, the phenomenon that tantalum and strontium react with each other according to an amount of bismuth thermally diffused in the lower electrode 5 as an underlying layer could be suppressed. Therefore, the concentration of tantalum in the first ferroelectric film 6c was not increased in the manner shown in FIG. 8, and the concentration of tantalum in each of the first and second ferroelectric films 6c and 6d became uniform. It is therefore considered that electric characteristics of the semiconductor device including the first and second ferroelectric films 6c and 6d according to the second embodiment were improved, compared to electric characteristics of the semiconductor device of the known example.

In the second embodiment of the present invention, the case where the concentration of tantalum contained in a CVD gas used for forming the first ferroelectric film 6c is set to be lower than the concentration of tantalum contained in a CVD gas used for forming the second ferroelectric film 6d has been described. In addition to this, as has been described in the first embodiment, the concentration of bismuth contained in a CVD gas used for forming the first ferroelectric film 6c may be set to be higher than the concentration of bismuth contained in a CVD gas used for forming the second ferroelectric film 6d. Thus, the respective concentrations of strontium, bismuth and tantalum in the first ferroelectric film 6c are substantially the same as respective concentrations of strontium, bismuth and tantalum in the second ferroelectric film 6d, respectively. Therefore, a semiconductor device with more excellent electric characteristics can be achieved.

Note that in the second embodiment of the present invention, the case where a ferroelectric film of an SBT film is formed by CVD has been described. However, even when an SBTN film containing Nb is formed by CVD or when a ferroelectric film, such as a BLT film, having a bismuth layer structure is formed by CVD, the same effects as those described above can be achieved.

Moreover, in the second embodiment of the present invention, the case where a ferroelectric film is formed by thermal CVD has been described. However, even if a ferroelectric film is formed by some other CVD technique, such as plasma CVD, which is performed by applying heat, the same effects as those described above can be obtained.

(Third Embodiment)

Hereinafter, a third embodiment of the present invention will be described with reference to FIG. 11.

Figure 11:
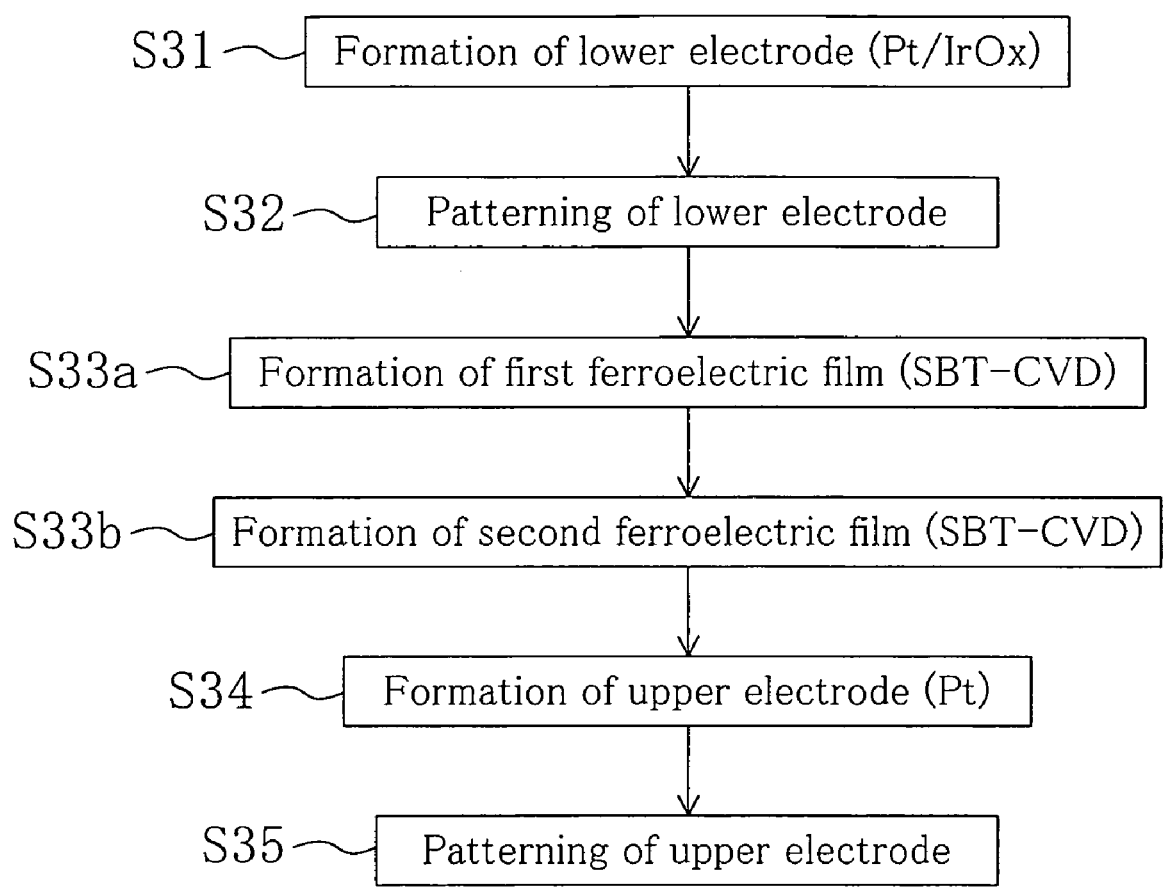
FIG. 11 is a flow chart showing a method for fabricating a semiconductor device according to a third embodiment of the present invention.

FIG. 11 is a flow chart showing a method for fabricating a semiconductor device according to the third embodiment of the present invention.

A lamination film of indium oxide, iridium and titanium aluminum nitride is formed on a semiconductor substrate in advance, and then a silicon oxide film is formed over the semiconductor substrate so as to cover the lamination film. Furthermore, a recess portion is formed in the silicon oxide film so that part of a surface of the lamination film is exposed through the recess portion (not shown).

Next, in Step S31, a lower electrode formed of a platinum (Pt) film is formed along inner surfaces of the recess portion in the silicon oxide film by sputtering. Note that the lower electrode may be formed of a lamination film of platinum (Pt) and iridium oxide ($IrO_x$).

Next, in Step S32, the lower electrode formed in Step S31 is patterned using lithography and etching.

Next, in Step S33a, using CVD, an SBT ($SrBi_2Ta_2O_9$) film to serve as a first ferroelectric film is deposited to a thickness of about 20 nm on the lower electrode patterned in Step S32. In this step, a CVD gas is prepared by adjusting the composition ratio of the CVD gas so that a final composition ratio of Sr:Bi:Ta in the first ferroelectric film is 1:2.24:2.

Next, in Step S33b, without the semiconductor substrate released to the atmosphere, in a reaction chamber in which the first ferroelectric film has been formed or in another chamber including the same equipment as that of the reaction chamber in which the first ferroelectric film has been formed, an SBT ($SrBi_2Ta_2O_9$) film as the second ferroelectric film is deposited by CVD to a thickness of about 40 nm on the first ferroelectric film formed in Step S33a. In this case, a CVD gas is prepared by adjusting the composition ratio of the CVD gas so that a final composition rate of Si:Bi:Ta in the second ferroelectric film is 1:2.24:2.

Next, in Step S34, an upper electrode of a platinum film is formed by sputtering on the second ferroelectric film formed in Step S33b.

Next, in Step S35, the upper electrode formed in Step S34 is patterned using lithography and etching.

Hereinafter, the reason why in the third embodiment of the present invention, the first and second ferroelectric films are continuously formed in a vacuum without the semiconductor substrate released to the atmosphere from Step S33a for forming the first ferroelectric film to Step S33b for forming the second ferroelectric film will be described.

Figure 12:
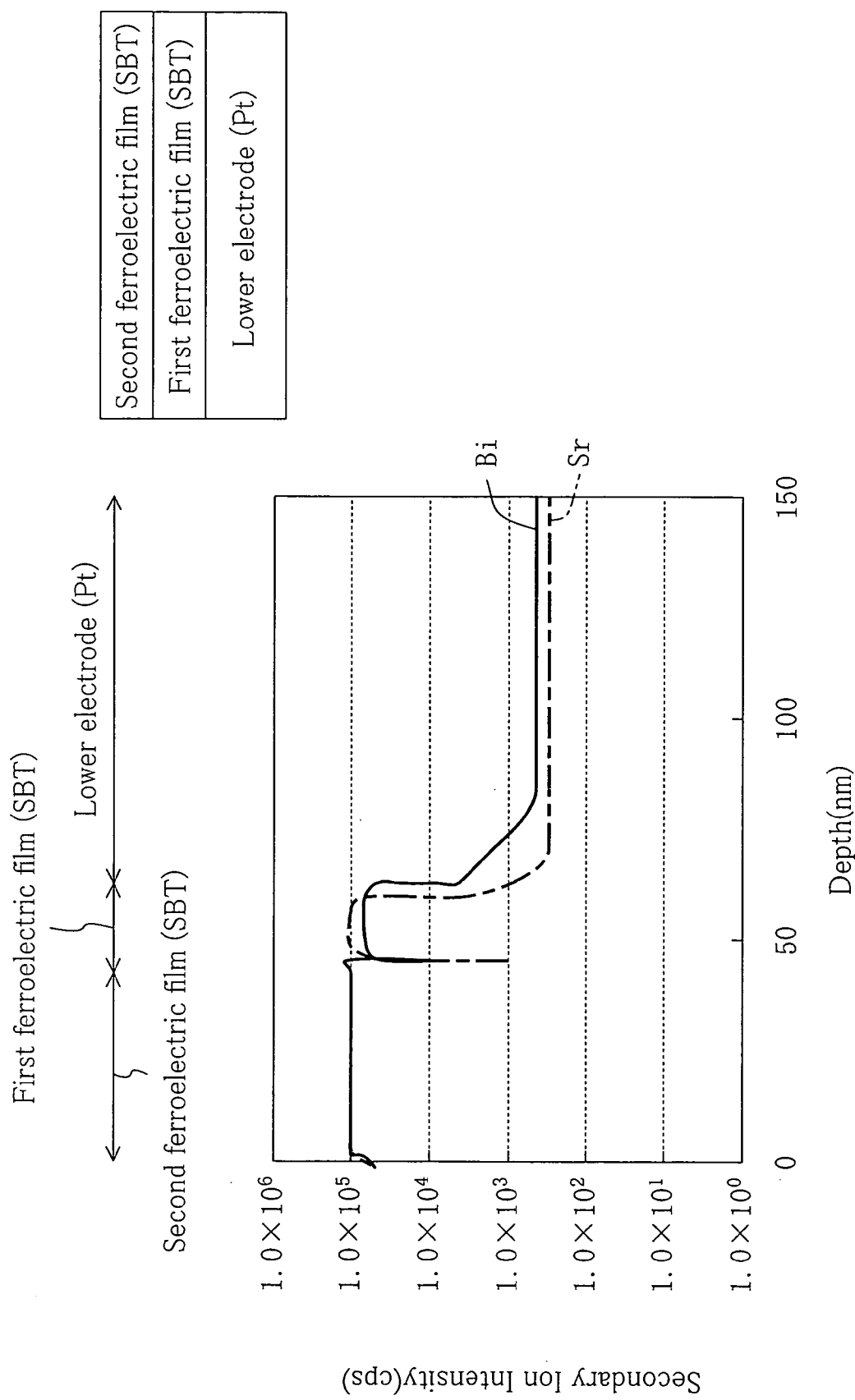
FIG. 12 is a graph showing bismuth distribution in the film thickness direction in the first and second ferroelectric films in the case where formation of first and second ferroelectric films is discontinuously performed in a manner in which a substrate is once released to the atmosphere during the film formation.

FIG. 12 is a graph showing results of SIMS analysis of bismuth concentration distribution in the film thickness direction in each of the first and second ferroelectric films in the case where the first and second ferroelectric films are discontinuously formed, unlike this embodiment, such as the case where, after the first ferroelectric film has been formed, the semiconductor substrate is once released to the atmosphere and then the second ferroelectric film is formed. Note that in FIG. 12, a standardized strontium concentration distribution in the first and second ferroelectric films is also shown.

As clearly shown in FIG. 12, a varied layer of which the strontium concentration or the bismuth concentration is abnormal is formed at an interface between the first and second ferroelectric films. In the same manner, although the tantalum concentration is not shown, an abnormal state was observed. A possible reason for the above-described results is that the first ferroelectric film is brought into contact with the atmosphere and a varied layer was formed because the semiconductor substrate was released to the atmosphere after formation of the first ferroelectric film. Note that the Pnv value of a solid capacitor including the first and second ferroelectric films was 9.5. This value does not exhibit excellent electric characteristics.

On the other hand, as in the first embodiment, when the first and second ferroelectric films were continuously formed in a vacuum without the semiconductor substrate released to the atmosphere, formation of the varied layer of FIG. 12 was not observed. Furthermore, it has been confirmed that by performing, in addition to this embodiment, the methods described in the first and second embodiments of the present invention, a uniform composition in the film thickness direction in the first and second embodiments can be achieved. In that case, a solid capacitor had a preferable Pnv value, i.e., 12.0 or more.

As has been described, in the third embodiment of the present invention, the first and second ferroelectric films are continuously formed in a vacuum without the semiconductor substrate released to the atmosphere, thereby preventing formation of a varied layer between the first and second ferroelectric films. Although this point is not particularly described in the first and second embodiments because a feature of each of the first and second embodiments is a CVD gas used for forming each of the first and second ferroelectric films, the first and second ferroelectric films are continuously formed in vacuum without the semiconductor substrate released to the atmosphere also in the first and second embodiments. As has been described, the first and second ferroelectric films are formed in this manner for the purpose of prevention of the formation of a varied layer between the first and second ferroelectric films. As clearly shown in FIG. 5 of the first embodiment and FIG. 10 of the second embodiment, no varied layer is formed between the first and second ferroelectric films. Moreover, for the same purpose, in the following fourth and fifth embodiments, the first and second ferroelectric films are continuously formed in vacuum without the semiconductor substrate released to the atmosphere.

(Fourth Embodiment)

Hereinafter, a method for fabricating a semiconductor device according to the fourth embodiment of the present invention will be described with reference to FIG. 13.

Figure 13:
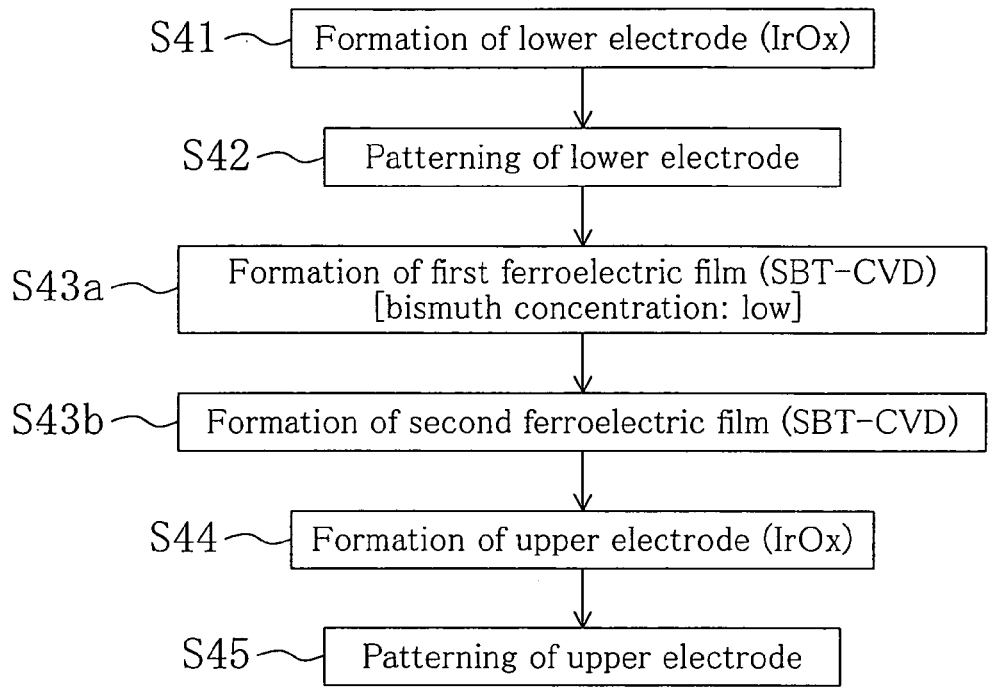
FIG. 13 is a flow chart showing a method for fabricating a semiconductor device according to a fourth embodiment of the present invention.

FIG. 13 is a flow chart showing a method for fabricating a semiconductor device according to the fourth embodiment of the present invention.

A lamination film of indium oxide, iridium and titanium aluminum nitride is formed on a semiconductor substrate in advance, and then a silicon oxide film is formed over the semiconductor substrate so as to cover the lamination film. Furthermore, a recess portion is formed in the silicon oxide film so that part of a surface of the lamination film is exposed through the recess portion (not shown).

Next, in Step S41, a lower electrode of iridium oxide ($IrO_x$) is formed along inner surfaces of the recess portion in the silicon oxide film by sputtering.

Next, in Step S42, the lower electrode formed in Step S41 is patterned using lithography and etching.

Next, in Step S43a, using CVD, an SBT ($SrBi_2Ta_2O_9$) film to serve as a first ferroelectric film is deposited to a thickness of about 20 nm on the lower electrode patterned in Step S42. In this step, the first ferroelectric film is formed, at a temperature of 350° C. and a pressure of $1.33 \times 10^2$ Pa (1 Torr), with a gas obtained by diluting ST-1 [$Sr(Ta(OEt)_5(OC_2H_4OMe))_2$] at a concentration of 0.1 mol % in ECH (ethylcyclohexane) flowing at a flow rate of $100 \times 10^{-3}$ ml/min, a gas obtained by diluting Bi (MMP)$_3$ at a concentration of 0.2 mol % in ECH (ethylcyclohexane) flowing at a flow rate of 190×10$^{-3}$ ml/min, a gas obtained by diluting PET [Ta(OC$_2$H$_5$)$_5$] at a concentration of 0.1 mol % in ECH (ethylcyclohexane) flowing at a flow rate of 100×10$^{-3}$ ml/min, an oxygen (O$_2$) gas flowing at a flow rate 1000×10$^{-3}$ ml/min, and an argon (Ar) gas flowing at a flow rate of 1900×10$^{-3}$ ml/min, and by bringing these source gases in reaction with one another for about 10 minutes.

Next, in Step S43b, using CVD, an SBT (SrBi$_2$Ta$_2$O$_9$) film to serve as a second ferroelectric film is deposited to a thickness of about 40 nm on the first ferroelectric film formed in Step S43a. In this step, the second ferroelectric film is formed at a temperature of 350° C. and a pressure of 1.33×10$^2$ Pa (1 Torr), with a gas obtained by diluting ST-1 [Sr(Ta(OEt)$_5$(OC$_2$H$_4$OMe))$_2$] at a concentration of 0.1 mol % in ECH (ethylcyclohexane) flowing at a flow rate of 100×10$^{-3}$ ml/min, a gas obtained by diluting Bi (MMP)$_3$ at a concentration of 0.2 mol % in ECH (ethylcyclohexane) flowing at a flow rate of 200×10$^{-3}$ ml/min, a gas obtained by diluting PET [Ta(OC$_2$H$_5$)$_5$] at a concentration of 0.1 mol % in ECH (ethylcyclohexane) flowing at a flow rate of 100×10$^{-3}$ ml/min, an oxygen (O$_2$) gas flowing at a flow rate 1000×10$^{-3}$ ml/min, and an argon (Ar) gas flowing at a flow rate of 1900×10$^{-3}$ ml/min, and by bringing these source gases in reaction with one another for about 20 minutes.

In this case, as has been described, the flow rate of the gas obtained by diluting Bi(MMP)$_3$ in ECH is set to be 190×10$^{-3}$ ml/min for a growth condition for the first ferroelectric film in Step S43a and the flow rate of the gas obtained by diluting Bi(MMP)$_3$ in ECH is set to be 200×10$^{-3}$ ml/min for a growth condition for the second ferroelectric film in Step S43b. In this manner, the concentration of bismuth contained in a CVD gas used for forming the first ferroelectric film is lower than the concentration of bismuth contained in a CVD gas used for forming the second ferroelectric film.

Next, in Step S44, an upper electrode of iridium oxide is formed by sputtering on the second ferroelectric film formed in Step S43b.

Next, in Step S45, the upper electrode formed in Step S44 is patterned using lithography and etching.

Through the above-described fabrication steps, the semiconductor device of this embodiment can be obtained. The composition ratio of Sr:Bi:Ta in the first ferroelectric film of the semiconductor was 1:2.24:2. The composition ratio of Sr:Bi:Ta in the second ferroelectric film of the semiconductor was 1:2.24:2. This shows that the bismuth concentration in the first ferroelectric film was substantially the same as the bismuth concentration in the second ferroelectric film. The structure of the semiconductor device of this embodiment was, for example, the same as the structure of FIG. 2 and therefore illustration thereof is omitted.

Hereinafter, the reason why in the fourth embodiment of the present invention, the concentration of bismuth contained in a CVD gas used for forming the first ferroelectric film is set to be lower than the concentration of bismuth contained in a CVD gas used for forming the second ferroelectric film will be described.

One of differences of the fourth embodiment of the present invention from the first embodiment of the present invention is that the lower electrode as an underlying layer under the first ferroelectric film is formed of iridium oxide.

When the lower electrode is formed of iridium oxide, bismuth, iridium and oxygen form an iridium bismuth oxide compound. Therefore, bismuth is not thermally diffused in the lower electrode but an iridium bismuth oxide compound is formed, so that a varied layer with a high bismuth concentration is formed at the interface between the lower electrode and the first ferroelectric film. Although illustration of data indicating this difference is omitted, it has been confirmed that a varied layer with a high bismuth concentration is formed at the interface between the lower electrode and the first ferroelectric film. The Pnv value of a solid capacitor in which the varied layer is formed was not a preferable value, i.e., 8.5.

In the fourth embodiment of the present invention, by setting the concentration of bismuth contained in a CVD gas used for forming the first ferroelectric film to be lower than the concentration of bismuth contained in a CVD gas used for forming the second ferroelectric film, formation of a varied layer with a high bismuth concentration at the interface between the lower electrode and the first ferroelectric film is prevented.

When the first and second ferroelectric films were formed using the method for fabricating a semiconductor device according to the fourth embodiment of the present invention, the bismuth composition ratios in the first and second ferroelectric films were approximately the same and the Pnv value of a solid capacitor including the first and second ferroelectric films was a preferable value, i.e., 12.5. The reason why the Pnv value of the solid capacitor of this embodiment was larger than the Pnv value of the solid capacitor of the first embodiment is unclear. However, it has been known that c-axis oriented components, which are not conducive to change in the Pnv value, exist in a ferroelectric film having a bismuth layer structure and, therefore, it is considered that the reason for the above-descried results is that orientation components, which are conducive to change in the Pnv value in an SBT film, are increased because the lower electrode of iridium oxide was used, instead of the lower electrode of platinum.

In the fourth embodiment of the present invention, the case where the lower electrode of iridium oxide and the upper electrode of iridium oxide are used have been described. However, even if iridium is used as a material for the lower electrode, iridium is oxidized and then iridium oxide is obtained, thus resulting in the same effects as those described above. Moreover, the upper electrode may be formed of a material of a single layer or a lamination layer including a metal film such as iridium, iridium oxide or platinum.

Note that in the fourth embodiment of the present invention, the case where a ferroelectric film of an SBT film is formed by CVD has been described. However, even if an SBTN film containing Nb is formed by CVD or even if a ferroelectric film, such as a BLT film, having a bismuth layer structure is formed by CVD, the same effects as those described above can be obtained.

Moreover, in the fourth embodiment of the present invention, the case where a ferroelectric film is formed by thermal CVD has been described. However, even if a ferroelectric film is formed by some other CVD technique, such as plasma CVD, than thermal CVD, the same effects as those described above can be obtained.

(Fifth Embodiment)

Hereinafter, a method for fabricating a semiconductor device according to the fifth embodiment of the present invention will be described with reference to FIG. 14.

Figure 14:
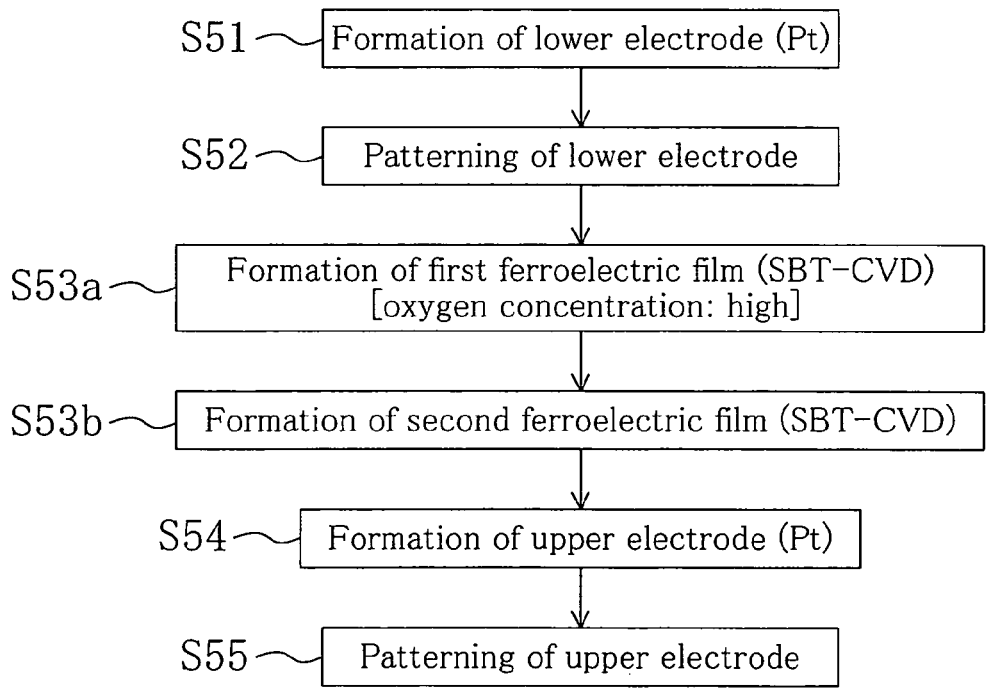
FIG. 14 is a flow chart showing a method for fabricating a semiconductor device according to a fifth embodiment of the present invention.
Figure 15:
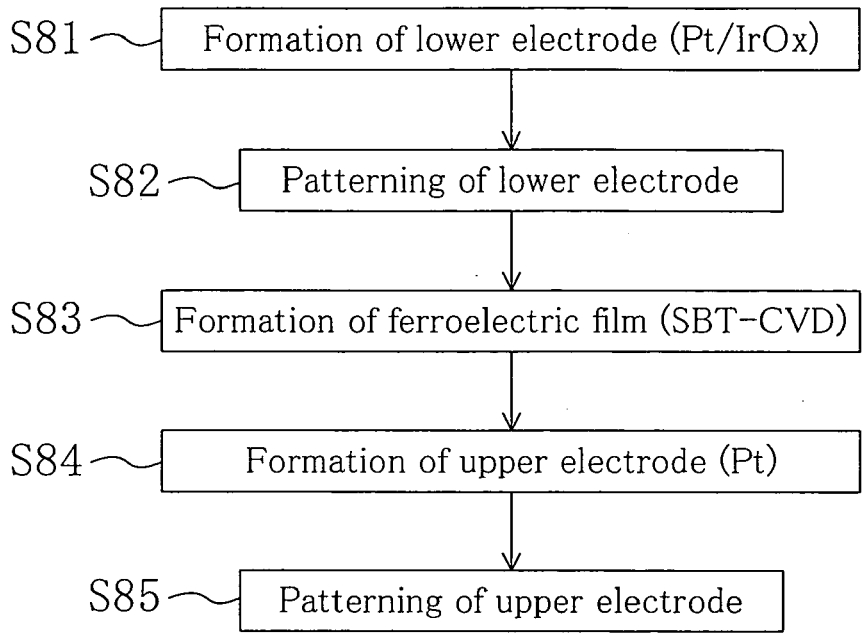
FIG. 15 is a flow chart showing a known method for fabricating a semiconductor device.
Figure 16:
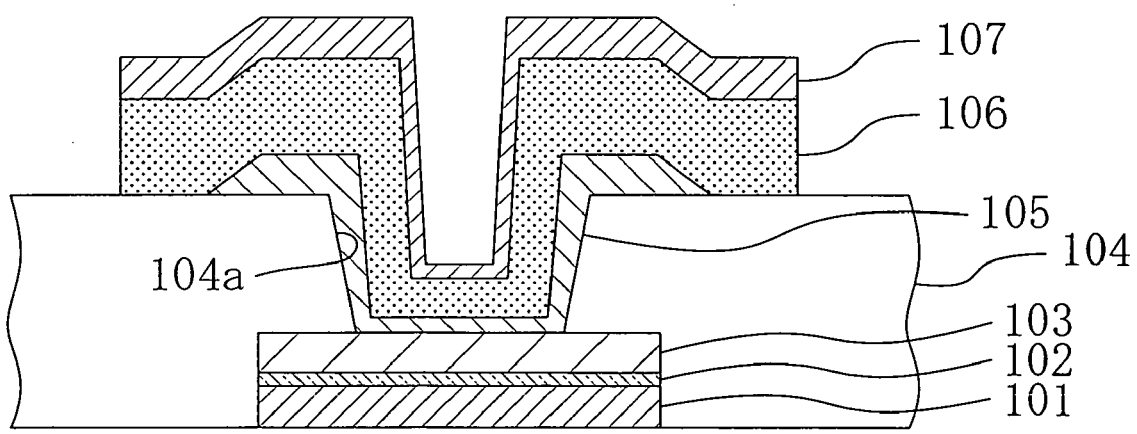
FIG. 16 is a cross-sectional view illustrating the structure of a known semiconductor device.

FIG. 14 is a flow chart showing a method for fabricating a semiconductor device according to the fifth embodiment of the present invention.

A lamination film of indium oxide, iridium and titanium aluminum nitride is formed on a semiconductor substrate in advance, and then a silicon oxide film is formed over the semiconductor substrate so as to cover the lamination film. Furthermore, a recess portion is formed in the silicon oxide film so that part of a surface of the lamination film is exposed through the recess portion (not shown).

Next, in Step S51, a lower electrode formed of a platinum (Pt) film is formed along inner surfaces of the recess portion in the silicon oxide film by sputtering. Note that the lower electrode may be formed of a lamination film of platinum (Pt) and iridium oxide ($IrO_x$).

Next, in Step S52, the lower electrode formed in Step S51 is patterned using lithography and etching.

Next, in Step S53a, using CVD, an SBT ($SrBi_2Ta_2O_9$) film to serve as a first ferroelectric film is deposited to a thickness of about 20 nm on the lower electrode patterned in Step S52. In this step, the first ferroelectric film is formed at a temperature of 330° C. and a pressure of $2.66 \times 10^2$ Pa (2 Torr), with a gas obtained by diluting ST-1 [$Sr(Ta(OEt)_5(OC_2H_4OMe))_2$] at a concentration of 0.1 mol % in ECH (ethylcyclohexane) flowing at a flow rate of $100 \times 10^{-3}$ ml/min, a gas obtained by diluting Bi $(MMP)_3$ at a concentration of 0.2 mol % in ECH (ethylcyclohexane) flowing at a flow rate of $200 \times 10^{-3}$ ml/min, a gas obtained by diluting PET [$Ta(OC_2H_5)_5$] at a concentration of 0.1 mol % in ECH (ethylcyclohexane) flowing at a flow rate of $100 \times 10^{-3}$ ml/min, an oxygen ($O_2$) gas flowing at a flow rate $2100 \times 10^{-3}$ ml/min, and an argon (Ar) gas flowing at a flow rate of $1900 \times 10^{-3}$ ml/min, and by bringing these source gases in reaction with one another for about 10 minutes.

Next, in Step S53b, using CVD, an SBT ($SrBi_2Ta_2O_9$) film to serve as a second ferroelectric film is deposited to a thickness of about 40 nm on the first ferroelectric film formed in Step S53a. In this step, the second ferroelectric film is formed at a temperature of 330° C. and a pressure of $2.66 \times 10^2$ Pa (2 Torr), with a gas obtained by diluting ST-1 [$Sr(Ta(OEt)_5(OC_2H_4OMe))_2$] at a concentration of 0.1 mol % in ECH (ethylcyclohexane) flowing at a flow rate of $100 \times 10^{-3}$ ml/min, a gas obtained by diluting Bi $(MMP)_3$ at a concentration of 0.2 mol % in ECH (ethylcyclohexane) flowing at a flow rate of $200 \times 10^{-3}$ ml/min, a gas obtained by diluting PET [$Ta(OC_2H_5)_5$] at a concentration of 0.1 mol % in ECH (ethylcyclohexane) flowing at a flow rate of $100 \times 10^{-3}$ ml/min, an oxygen ($O_2$) gas flowing at a flow rate $1000 \times 10^{-3}$ ml/min, and an argon (Ar) gas flowing at a flow rate of $1900 \times 10^{-3}$ ml/min, and by bringing these source gases in reaction with one another for about 20 minutes.

In this case, as has been described, the flow rate of the oxygen ($O_2$) gas is set to be $2100 \times 10^{-3}$ ml/min for a growth condition for the first ferroelectric film in Step S53a and the flow rate of the oxygen ($O_2$) gas is set to be $1000 \times 10^{-3}$ ml/min for a growth condition for the second ferroelectric film in Step S53b. In this manner, the concentration of oxygen contained in a CVD gas used for forming the first ferroelectric film is higher than the concentration of oxygen contained in a CVD gas used for forming the second ferroelectric film.

Next, in Step S54, an upper electrode of a platinum film is formed by sputtering on the second ferroelectric film formed in Step S53b.

Next, in Step S55, the upper electrode formed in Step S54 is patterned using lithography and etching.

Through the above-described fabrication steps, the semiconductor device of this embodiment can be obtained. Moreover, the bismuth concentration in the first ferroelectric film is substantially the same as the bismuth concentration in the second ferroelectric film. The structure of the semiconductor device of this embodiment is, for example, the same as the structure of FIG. 2 and therefore illustration thereof is omitted.

Hereinafter, the reason why in the fifth embodiment of the present invention, the concentration of oxygen contained in a CVD gas used for forming the first ferroelectric film is set to be higher than the concentration of oxygen contained in a CVD gas used for forming the second ferroelectric film will be described.

In CVD, a ferroelectric film is formed by bringing CVD gases into reaction with one another with a heat of about 300–400° C. In an initial stage of film formation, bismuth is thermally diffused into an electrode of a platinum film as an underlying layer. This is considered to be the reason why the concentration of bismuth is lower in a lower part of the obtained SBT film. Therefore, in the first embodiment of the present invention, as has been described, the first ferroelectric film is formed using a CVD gas with an increased bismuth concentration according to the amount of bismuth diffused in the lower electrode of platinum as an underlying layer and the second ferroelectric film is formed using a CVD gas having a normal bismuth concentration, i.e., a lower concentration than that of a CVD gas used for forming the first ferroelectric film.

When CVD is performed at a temperature of about 350° C., concentration change in an obtained SBT film occurs according to change in supply of CVD gases. The reason for this is that formation of an SBT film by CVD proceeds depending on the rate of gas supply. On the other hand, when a solid capacitor is formed, a ferroelectric film has to be formed on an underlying layer having an uneven spot. In that case, if film formation is performed such that the film formation proceeds depending on the rate of gas supply, step coverage in the ferroelectric film starts being deteriorated at about 350° C. Therefore, only within a small temperature range, a ferroelectric film can be stably formed in a mass production while excellent step coverage is maintained in an uneven underlying layer. To solve this problem, film formation can be performed while the gases are brought into reaction with one another by a heat at a temperature of about 300–350° C. However, the film formation proceeds depending on the rate of reaction of the gases within a temperature range of about 300–350° C. Therefore, even though adjustment is made for supply of the CVD gases so that the ferroelectric film has a desired composition, an SBT film with a composition which does not correspond to the change in the supply of the gases is obtained.

As a result of keen examinations in view of the above-described problems, a technique for obtaining an SBT ($SrBi_2Ta_2O_9$) film with a desired composition even when film formation is performed depending on the rate of reaction of the gasses has been devised. Specifically, in film formation proceeding depending on the rate of reaction of the gases, regardless of the respective concentrations of strontium, bismuth and tantalum in the CVD gases, an SBT ($SrBi_2Ta_2O_9$) film of which composition is not changed from a desired component can be obtained. In an actual situation, as has been described, bismuth is thermally diffused into the lower electrode, so that composition change is caused in the formation proceeding depending on the rate of reaction of the gases. Therefore, in this embodiment, a sufficient volume of oxygen is supplied when the first ferroelectric film is formed to obtain an oxygen-rich atmosphere, so that thermal diffusion of bismuth into the lower electrode can be prevented. Thus, the concentration of bismuth in the first ferroelectric film and the concentration of bismuth in the second ferroelectric film can be made to be substantially the same to one another. In this manner, uniformity of the bismuth concentration in each of the first and second ferroelectric film can be improved in the film thickness direction.

Moreover, the Pnv value of a solid capacitor constituting the semiconductor device of the fifth embodiment of the present invention was substantially equal to the Pnv value of the solid capacitor constituting the semiconductor device of the first embodiment of the present invention. This shows that the semiconductor device of the fifth embodiment of the present invention has a preferable Pnv value exhibiting excellent electric characteristics as in the first embodiment.

Moreover, in the fifth embodiment, the concentration of oxygen contained in a CVD gas used for forming the first ferroelectric film is adjusted so that the respective bismuth concentrations of the first and second ferroelectric films are equal to each other. In addition to this, as in the second embodiment of the present invention, the concentration of tantalum contained in a CVD gas used for forming the first ferroelectric film may be reduced. Thus, the respective concentrations of strontium, bismuth and tantalum contained in the first and second ferroelectric films become substantially the same. Therefore, a semiconductor device having even more excellent electric characteristics can be achieved.

Note that in the fifth embodiment of the present invention, the case where a ferroelectric film of an SBT film is formed by CVD has been described. However, even if an SBTN film containing Nb is formed by CVD or even if a ferroelectric film, such as a BLT film, having a bismuth layer structure is formed by CVD, the same effects as those described above can be obtained.

Moreover, in the fifth embodiment of the present invention, the case where a ferroelectric film is formed by thermal CVD has been described. However, even if a ferroelectric film is formed by some other CVD technique, such as plasma CVD, which is performed by applying heat, the same effects as those described above can be obtained.

A method for fabricating a semiconductor device and a semiconductor device according to the present invention allow prevention of composition change along the film thickness direction in a ferroelectric film constituting a ferroelectric capacitor and therefore are particularly useful for a semiconductor device using a ferroelectric film formed by CVD and a method for fabricating the semiconductor device.

What is claimed is:

1. A method for fabricating a semiconductor device, comprising the steps of:
   forming a lower electrode on a semiconductor substrate;
   forming a first ferroelectric film on the lower electrode by CVD using a first source gas;
   forming a second ferroelectric film on the first ferroelectric film by CVD using a second source gas; and
   forming an upper electrode on the second ferroelectric film,
   wherein a concentration of bismuth contained in the first source gas is different from a concentration of bismuth contained in the second source gas.

2. The method of claim 1, wherein each of the first and second ferroelectric films is formed of a component of the same type, and
   wherein the concentration of bismuth contained in the first ferroelectric film is approximately equal to the concentration of bismuth contained in the second ferroelectric film.

3. The method of claim 1, wherein each of the first and second ferroelectric films is formed of a ferroelectric material having a bismuth layer structure.

4. The method of claim 1, further comprising:
   before the step of forming the lower electrode on the semiconductor substrate, the step of forming an insulation film on the semiconductor substrate so as to have a recess portion,
   wherein each of the lower electrode, the first ferroelectric film, the second ferroelectric film and the upper electrode is formed along inner surfaces of the recess portion.

5. A method for fabricating a semiconductor device, comprising the steps of:
   forming a lower electrode on a semiconductor substrate;
   forming a first ferroelectric film on the lower electrode by CVD using a first source gas;
   forming a second ferroelectric film on the first ferroelectric film by CVD using a second source gas; and
   forming an upper electrode on the second ferroelectric film,
   wherein a concentration of oxygen contained in the first source gas is higher than a concentration of oxygen contained in the second source gas.

6. The method of claim 5, wherein each of the first and second ferroelectric films is formed of a component of the same type, and
   wherein the concentration of bismuth contained in the first ferroelectric film is approximately equal to the concentration of bismuth contained in the second ferroelectric film.

7. The method of claim 5, wherein each of the first and second ferroelectric films is formed of a ferroelectric material having a bismuth layer structure.

8. The method of claim 5, further comprising:
   before the step of forming the lower electrode on the semiconductor substrate, the step of forming an insulation film on the semiconductor substrate so as to have a recess portion,
   wherein each of the lower electrode, the first ferroelectric film, the second ferroelectric film and the upper electrode is formed along inner surfaces of the recess portion.

9. A method for fabricating a semiconductor device, comprising the steps of:
   forming a lower electrode on a semiconductor substrate;
   forming a first ferroelectric film on the lower electrode by CVD using a first source gas;
   forming a second ferroelectric film on the first ferroelectric film by CVD using a second source gas; and
   forming an upper electrode on the second ferroelectric film,
   wherein a concentration of tantalum contained in the first source gas is lower than a concentration of tantalum contained in the second source gas.

10. The method of claim 9, wherein each of the first and second ferroelectric films is formed of a component of the same type, and
    wherein the concentration of tantalum contained in the first ferroelectric film is approximately equal to the concentration of tantalum contained in the second ferroelectric film.

11. The method of claim 9, wherein each of the first and second ferroelectric films is formed of a ferroelectric material having a bismuth layer structure.

12. The method of claim 9, further comprising:
before the step of forming the lower electrode on the semiconductor substrate, the step of forming an insulation film on the semiconductor substrate so as to have a recess portion,
wherein each of the lower electrode, the first ferroelectric film, the second ferroelectric film and the upper electrode is formed along inner surfaces of the recess portion.

13. A method for fabricating a semiconductor device, comprising the steps of:
forming a lower electrode on a semiconductor substrate;
forming a first ferroelectric film on the lower electrode by CVD using a first source gas;
forming a second ferroelectric film on the first ferroelectric film by CVD using a second source gas; and
forming an upper electrode on the second ferroelectric film,
wherein each of the first and second ferroelectric films is formed of a ferroelectric material having a bismuth layer structure,
wherein a concentration of bismuth contained in the first source gas is different from a concentration of bismuth contained in the second source gas, and
wherein a concentration of tantalum contained in the first source gas is lower than a concentration of tantalum contained in the second source gas.

14. The method of claim 13, further comprising:
before the step of forming the lower electrode on the semiconductor substrate, the step of forming an insulation film on the semiconductor substrate so as to have a recess portion,
wherein each of the lower electrode, the first ferroelectric film, the second ferroelectric film and the upper electrode is formed along inner surfaces of the recess portion.

15. A method for fabricating a semiconductor device, comprising the steps of:
forming a lower electrode on a semiconductor substrate;
forming a first ferroelectric film on the lower electrode by CVD using a first source gas;
forming a second ferroelectric film on the first ferroelectric film by CVD using a second source gas; and
forming an upper electrode on the second ferroelectric film,
wherein each of the first and second ferroelectric films is formed of a ferroelectric material having a bismuth layer structure,
wherein a concentration of oxygen contained in the first source gas is higher than a concentration of oxygen contained in the second source gas, and
wherein a concentration of tantalum contained in the first source gas is lower than a concentration of tantalum contained in the second source gas.

16. The method of claim 15, further comprising:
before the step of forming the lower electrode on the semiconductor substrate, the step of forming an insulation film on the semiconductor substrate so as to have a recess portion,
wherein each of the lower electrode, the first ferroelectric film, the second ferroelectric film and the upper electrode is formed along inner surfaces of the recess portion.

17. A semiconductor device comprising:
a lower electrode formed on a semiconductor substrate;
a first ferroelectric film formed on the lower electrode;
a second ferroelectric film formed on the first ferroelectric film; and
an upper electrode formed on the second ferroelectric film,
wherein a concentration of bismuth contained in the first ferroelectric film is approximately equal to a concentration of bismuth contained in the second ferroelectric film, and
the bismuth contained in the first ferroelectric film is thermally diffused in an upper part of the lower electrode.

18. The semiconductor device of claim 17, wherein each of the first and second ferroelectric films is formed of a ferroelectric material having a bismuth layer structure.

19. The semiconductor device of claim 17, wherein each of the lower electrode, the first ferroelectric film, the second ferroelectric film and the upper electrode is formed along inner surfaces of a recess portion in an insulation film formed on the semiconductor substrate.

20. A semiconductor device comprising:
a lower electrode formed on a semiconductor substrate;
a first ferroelectric film formed on the lower electrode;
a second ferroelectric film formed on the first ferroelectric film; and
an upper electrode formed on the second ferroelectric film,
wherein a concentration of tantalum contained in the first ferroelectric film is approximately equal to a concentration of tantalum contained in the second ferroelectric film.

21. The semiconductor device of claim 20, wherein each of the first and second ferroelectric films is formed of a ferroelectric material having a bismuth layer structure.

22. The semiconductor device of claim 20, wherein each of the lower electrode, the first ferroelectric film, the second ferroelectric film and the upper electrode is formed along inner surfaces of a recess portion in an insulation film formed on the semiconductor substrate.

23. A semiconductor device comprising:
a lower electrode formed on a semiconductor substrate;
a first ferroelectric film formed on the lower electrode;
a second ferroelectric film formed on the first ferroelectric film; and
an upper electrode formed on the second ferroelectric film,
wherein each of the first and second ferroelectric films is formed of a ferroelectric material having a bismuth layer structure,
wherein a concentration of bismuth contained in the first ferroelectric film is approximately equal to a concentration of bismuth contained in the second ferroelectric film, and
wherein a concentration of tantalum contained in the first ferroelectric film is approximately equal to a concentration of tantalum contained in the second ferroelectric film.

24. The semiconductor device of claim 23, wherein each of the lower electrode, the first ferroelectric film, the second ferroelectric film and the upper electrode is formed along inner surfaces of a recess portion in an insulation film formed on the semiconductor substrate.

25. The method of claim 1, wherein a temperature at which the first ferroelectric film is formed is approximately the same as a temperature at which the second ferroelectric film is formed.

26. The semiconductor device of claim 17, wherein the first ferroelectric film is in contact with the lower electrode.

27. The semiconductor device of claim 20, wherein the first ferroelectric film is in contact with the lower electrode.

28. The semiconductor device of claim 23, wherein the first ferroelectric film is in contact with the lower electrode.

29. The semiconductor device of claim 17, wherein the first ferroelectric film and the second ferroelectric film have a substantially uniform bismuth concentration in the film thickness direction.

* * * * *